(12) United States Patent
Kurashina et al.

(10) Patent No.: US 10,908,558 B2
(45) Date of Patent: Feb. 2, 2021

(54) CIRCUIT DEVICE, PHYSICAL QUANTITY MEASUREMENT DEVICE, ELECTRONIC APPARATUS, AND VEHICLE

(71) Applicant: Seiko Epson Corporation, Tokyo (JP)

(72) Inventors: Takashi Kurashina, Matsumoto (JP); Katsuhiko Maki, Chino (JP)

(73) Assignee: Seiko Epson Corporation

(*) Notice: Subject to any disclaimer, the term of this patent is extended or adjusted under 35 U.S.C. 154(b) by 107 days.

(21) Appl. No.: 15/712,879

(22) Filed: Sep. 22, 2017

(65) Prior Publication Data

US 2018/0088536 A1 Mar. 29, 2018

(30) Foreign Application Priority Data

Sep. 27, 2016 (JP) ................. 2016-187912

(51) Int. Cl.
*H03L 7/06* (2006.01)
*G04F 10/00* (2006.01)
*H03L 7/18* (2006.01)
*H03L 7/181* (2006.01)
*H03L 7/093* (2006.01)
*H03L 7/099* (2006.01)

(52) U.S. Cl.
CPC ............ *G04F 10/005* (2013.01); *H03L 7/093* (2013.01); *H03L 7/0992* (2013.01); *H03L 7/18* (2013.01); *H03L 7/181* (2013.01); *B60L 2200/00* (2013.01)

(58) Field of Classification Search
CPC .................................. G04F 10/005; H03L 7/18
USPC ........................................................ 327/159
See application file for complete search history.

(56) References Cited

U.S. PATENT DOCUMENTS

| | | | |
|---|---|---|---|
| 7,259,601 B2 | 8/2007 | Zarate et al. | |
| 7,304,510 B2 | 12/2007 | Matsuta | |
| 7,486,119 B2 | 2/2009 | Lee | |
| 7,830,191 B2 | 11/2010 | Kojima et al. | |
| 8,222,935 B2 | 7/2012 | Awata | |
| 8,421,661 B1* | 4/2013 | Jee | G04F 10/005 341/143 |
| 8,462,840 B2 | 6/2013 | Chen et al. | |
| 8,552,776 B2 | 10/2013 | Kwak et al. | |
| 9,068,896 B2 | 6/2015 | Yun et al. | |
| 9,229,433 B1 | 1/2016 | Hiebert et al. | |
| 10,247,621 B1* | 4/2019 | Partridge | G01K 7/32 |
| 2002/0033736 A1* | 3/2002 | Heymann | H03L 7/235 331/2 |
| 2003/0076181 A1 | 4/2003 | Tabatabaei et al. | |

(Continued)

FOREIGN PATENT DOCUMENTS

| | | |
|---|---|---|
| CN | 101079630 A | 11/2007 |
| EP | 2818946 A1 | 12/2014 |

(Continued)

*Primary Examiner* — Metasebia T Retebo
(74) *Attorney, Agent, or Firm* — Harness, Dickey & Pierce, P.L.C.

(57) ABSTRACT

A circuit device includes a time-to-digital conversion circuit, to which a first clock signal generated using a first resonator, and having a first clock frequency, and a second clock signal generated using a second resonator, and having a second clock frequency different from the first clock frequency are input, and which converts time into a digital value using the first and second clock signals, and a PLL circuit adapted to perform phase synchronization between the first and second clock signals.

15 Claims, 18 Drawing Sheets

(56) References Cited

U.S. PATENT DOCUMENTS

| | | |
|---|---|---|
| 2006/0040632 A1* | 2/2006 | Buznitsky ................. G06F 1/06 455/255 |
| 2007/0046347 A1 | 3/2007 | Lee |
| 2008/0048739 A1 | 2/2008 | Nakaya et al. |
| 2008/0136479 A1 | 6/2008 | You et al. |
| 2009/0184741 A1 | 7/2009 | Suda et al. |
| 2009/0256577 A1 | 10/2009 | Hasumi et al. |
| 2010/0052751 A1 | 3/2010 | Abe |
| 2010/0128247 A1 | 5/2010 | Heizmann et al. |
| 2010/0182186 A1 | 7/2010 | Lin et al. |
| 2011/0128055 A1 | 6/2011 | Pelgrom et al. |
| 2011/0169673 A1 | 7/2011 | Henzler |
| 2011/0304361 A1 | 12/2011 | Henzler et al. |
| 2014/0361840 A1 | 12/2014 | Liu et al. |
| 2015/0061781 A1 | 3/2015 | Shimura |
| 2015/0145572 A1 | 5/2015 | Sato |
| 2015/0162917 A1 | 6/2015 | Tsukuda |
| 2016/0103423 A1 | 4/2016 | Chang et al. |
| 2016/0173108 A1 | 6/2016 | Oshita et al. |
| 2017/0230051 A1 | 8/2017 | Oshita et al. |
| 2018/0053058 A1* | 2/2018 | Konishi ................. G02F 1/133 |
| 2018/0088160 A1 | 3/2018 | Maki et al. |
| 2018/0091158 A1 | 3/2018 | Sudo et al. |

FOREIGN PATENT DOCUMENTS

| | | | |
|---|---|---|---|
| JP | 64-079687 A | | 3/1989 |
| JP | 05-087954 A | | 4/1993 |
| JP | 2001-141853 A | | 5/2001 |
| JP | 2007-110370 A | | 4/2007 |
| JP | 2009-246484 A | | 10/2009 |
| JP | 2010-119077 A | | 5/2010 |
| JP | 2010-122222 A | | 6/2010 |
| JP | 2011232144 A | * | 11/2011 |
| JP | 2015-114749 A | | 6/2015 |

* cited by examiner

US 10,908,558 B2

CIRCUIT DEVICE, PHYSICAL QUANTITY MEASUREMENT DEVICE, ELECTRONIC APPARATUS, AND VEHICLE

BACKGROUND

1. Technical Field

The present invention relates to a circuit device, a physical quantity measurement device, an electronic apparatus, a vehicle, and so on.

2. Related Art

In the past, there has been known a circuit device having a time-to-digital conversion circuit. The time-to-digital conversion circuit converts time into a digital value. As related art examples of a circuit device having such a time-to-digital conversion circuit, there are known related art technologies disclosed in, for example, JP-A-2009-246484 (Document 1), JP-A-2007-110370 (Document 2), JP-A-2010-119077 (Document 3) and JP-A-5-87954 (Document 4).

In the related art technologies of Documents 1 through 3, the time-to-digital conversion is realized using a so-called vernier delay circuit. In the vernier delay circuit, the time-to-digital conversion is realized using delay elements as semiconductor elements.

In Document 4, there is disclosed a minute time measurement device provided with a first quartz crystal oscillator for outputting a first pulse, a second quartz crystal oscillator for outputting a second clock pulse, an edge matching detection circuit, a synchronous counter, a microcomputer, and a transmission time control section. The edge matching detection circuit detects a synchronization point between the first and second clock pulses. The synchronous counter performs a counting operation in sync with the first and second clock pulses. The microcomputer calculates the unknown time from a start pulse to a stop pulse based on the value of the synchronous counter. The transmission time control section outputs the start pulse in accordance with the output of the edge matching circuit, and the values of the synchronous counter and the microcomputer.

In the related art technology of Document 4, the edge matching detection circuit detects the synchronization point where the falling edges of the first and second clock pulses coincide with each other. Then, in the case in which the synchronization point is detected, the synchronous counter starts the counting process in sync with the first and second clock pulses, and then performs the time measurement for calculating the unknown time from the start pulse to the stop pulse based on the result of the counting process.

However, in this related art technology, since the time measurement cannot be started unless the synchronization point is detected, the conversion time of the time-to-digital conversion increases. Further, in the case in which the relationship in clock frequency between the first and second clock pulses is in the frequency relationship in which the edges fail to coincide with each other at the synchronization point, it is difficult to realize the time-to-digital conversion. Further, since the timing to be the reference of the process of the time-to-digital conversion cannot appropriately be set, the process of the time-to-digital conversion becomes complicated. Further, if an error exists in the matching detection of the edges of the clock pulses at the synchronization point, the accuracy of the time-to-digital conversion deteriorates.

SUMMARY

An advantage of some aspects of the invention is possible to provide a circuit device, a physical quantity measurement device, an electronic apparatus, a vehicle and so on capable of improving the performance and simplification of the process of the time-to-digital conversion.

The invention can be implemented as the following forms or embodiments.

An aspect of the invention relates to a circuit device including a time-to-digital conversion circuit, to which a first clock signal generated using a first resonator, and having a first clock frequency, and a second clock signal generated using a second resonator, and having a second clock frequency different from the first clock frequency are input, and which converts time into a digital value using the first clock signal and the second clock signal, and a PLL circuit adapted to perform phase synchronization between the first clock signal and the second clock signal.

According to this aspect of the invention, the phase synchronization between the first and second clock signals generated using the first and second resonators is achieved by the PLL circuit. Further, the time-to-digital conversion circuit performs the time-to-digital conversion of conversing time into a digital value using the first and second clock signals having the first and second clock frequencies synchronized in phase with each other in such a manner. By adopting this configuration, it becomes possible to realize the improvement in performance and the simplification of the time-to-digital conversion process using the first and second clock signals.

In the aspect of the invention, it is also possible that the time-to-digital conversion circuit converts the time into the digital value with resolution corresponding to a frequency difference between the first clock frequency and the second clock frequency.

By adopting this configuration, it becomes possible to set the resolution of the time-to-digital conversion using the frequency difference between the first and second clock frequencies, and the improvement in performance of the time-to-digital conversion can be realized.

In the aspect of the invention, it is also possible that defining the first clock frequency as f1 and the second clock frequency as f2, the time-to-digital conversion circuit converts the time into the digital value with the resolution Δt expressed as follows.

$$\Delta t = |1/f1 - 1/f2| = |f1 - f2|/(f1 \times f2)$$

By adopting this configuration, it becomes possible to make the resolution finer by, for example, decreasing the frequency difference between the first and second clock frequencies, and setting the first and second clock frequencies to higher frequencies, and it is possible to realize the improvement in performance of the time-to-digital conversion.

In the aspect of the invention, it is also possible that defining the first clock frequency as f1 and the second clock frequency as f2, the PLL circuit performs the phase synchronization between the first clock signal and the second clock signal so as to fulfill N/f1=M/f2 (N, M are integers different from each other and each no smaller than 2).

By adopting this configuration, the phase synchronization at appropriate phase synchronization timing becomes possible, and it becomes possible to achieve the improvement in performance and the simplification of the time-to-digital conversion process.

In the aspect of the invention, it is also possible that defining the resolution of the time-to-digital conversion as Δt, the PLL circuit performs the phase synchronization between the first clock signal and the second clock signal so as to fulfill the following expression.

$$\Delta t = |N-M|/(N \times f2) = |N-M|/(M \times f1)$$

By adopting this configuration, it becomes possible to set the values N, M and so on in accordance with the resolution Δt required for the time-to-digital conversion, and achieve the phase synchronization between the first and second clock signals.

In the aspect of the invention, it is also possible that the PLL circuit includes a phase detector adapted to perform phase comparison between one of the first clock signal and a signal based on the first clock signal, and one of the second clock signal and a signal based on the second clock signal.

By adopting this configuration, it becomes possible to realize the phase synchronization between the first and second clock signals due to the feedback control of the phase comparison result performed in the phase detector.

In the aspect of the invention, it is also possible that the PLL circuit includes a first frequency divider circuit adapted to divide the frequency of the first clock signal to obtain a first frequency-divided clock signal, and output the first frequency-divided clock signal to the phase detector as the signal based on the first clock signal, and a second frequency divider circuit adapted to divide the frequency of the second clock signal to obtain a second frequency-divided clock signal, and output the second frequency-divided clock signal to the phase detector as the signal based on the second clock signal.

By providing such first and second frequency divider circuits, it becomes possible to realize the phase synchronization between the first and second clock signals by performing the feedback control of the phase comparison result between the first and second frequency-divided clock signals in the phase detector.

In the aspect of the invention, it is also possible that defining the first clock frequency as f1 and the second clock frequency as f2, the first frequency divider circuit divides the frequency of the first clock signal, and the second frequency divider circuit divides the frequency of the second clock signal so as to fulfill N/f1=M/f2 (N, M are integers different from each other and each no smaller than 2).

By adopting this configuration, the phase synchronization at appropriate phase synchronization timing becomes possible, and it becomes possible to achieve the improvement in performance and the simplification of the time-to-digital conversion process.

In the aspect of the invention, it is also possible to further include a first oscillation circuit controlled based on a phase comparison result of the phase detector, and adapted to oscillate the first resonator to generate the first clock signal.

By adopting this configuration, it becomes possible to realize the phase synchronization between the first and second clock signals by adjusting, for example, the first clock frequency of the first clock signal based on the phase detection result in the phase detector.

In the aspect of the invention, it is also possible to further include a second oscillation circuit adapted to oscillate the second resonator to generate the second clock signal.

By performing the time-to-digital conversion using the first and second clock signals generated by the first and second resonators as described above, it is possible to achieve the improvement in accuracy and so on of the time-to-digital conversion compared to the method of using the semiconductor element.

In the aspect of the invention, it is also possible that the time-to-digital conversion circuit converts a time difference in transition timing between a first signal and a second signal into a digital value.

By adopting this configuration, it becomes possible to convert the time difference in transition timing between the first and second signal with high accuracy using the first and second clock signals generated by the first and second resonators.

Another aspect of the invention relates to a physical quantity measurement device including any one of the circuit devices described above, the first resonator adapted to generate the first clock signal, and the second resonator adapted to generate the second clock signal.

By performing the time-to-digital conversion using the first and second resonators as described above, the measurement process of the physical quantity higher inaccuracy becomes possible.

Another aspect of the invention relates to an electronic apparatus including any one of the circuit devices described above.

Another aspect of the invention relates to a vehicle including any one of the circuit devices described above.

BRIEF DESCRIPTION OF THE DRAWINGS

The invention will be described with reference to the accompanying drawings, wherein like numbers reference like elements.

DESCRIPTION OF AN EXEMPLARY EMBODIMENT

A preferred embodiment of the invention will hereinafter be described in detail. It should be noted that the embodiment described hereinafter does not unreasonably limit the content of the invention as set forth in the appended claims, and all of the constituents described in the embodiment are not necessarily essential as the elements for solving the problem of the invention.

1. Circuit Device

Figure 1:
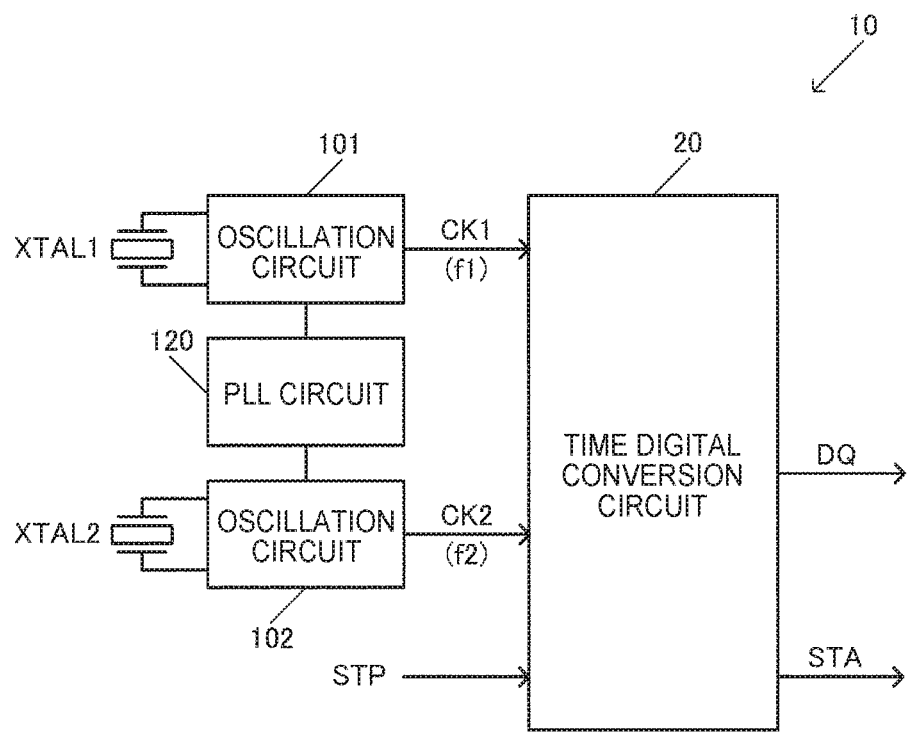
FIG. 1 is a diagram showing a configuration example of a circuit device according to an embodiment of the invention.

FIG. 1 shows a configuration example of a circuit device 10 according to the present embodiment. The circuit device 10 includes a time-to-digital conversion circuit 20, and a PLL circuit 120. Further, the circuit device 10 can include oscillation circuits 101, 102. It should be noted that the configuration of the circuit device is not limited to the configuration shown in FIG. 1, but a variety of practical modifications such as elimination of some of the constituents (e.g., the oscillation circuits) or addition of other constituents are possible.

The time-to-digital conversion circuit 20 converts time into a digital value using a clock signal CK1 and a clock signal CK2. Specifically, there are input the clock signal CK1 (a first clock signal) with a clock frequency f1 (a first clock frequency) generated using an resonator XTAL1 (a first resonator), and the clock signal CK2 (a second clock signal) with a clock frequency f2 (a second clock frequency) generated using an resonator XTAL2 (a second resonator). Then, the time is converted to the digital value using the clock signals CK1, CK2. In the example shown in FIG. 1, the time-to-digital conversion circuit 20 converts the time difference in transition timing between a signal STA (a first signal, e.g., a start signal) and a signal STP (a second signal, e.g., a stop signal) into the digital value DQ using the clock signals CK1, CK2 with the clock frequencies f1, f2. It should be noted that although there is hereinafter described mainly the case of applying the method of the present embodiment to the time-to-digital conversion of converting the time difference in transition timing between the signals STA, STP (the first and second signals) into the digital value, the present embodiment is not limited to this case. For example, it is also possible to apply the method of the present embodiment to the time-to-digital conversion for measuring, for example, absolute time, and so on.

The clock frequency f2 is a frequency different from the clock frequency f1, and is, for example, a frequency lower than the clock frequency f1. Further, the time difference in transition timing between the signal STA and the signal STP is the time difference between the edges (e.g., between the rising edges, or between the falling edges) of the signal STA and the signal STP. Further, it is also possible for the time-to-digital conversion circuit 20 to perform a filter process (a digital filter process, a low-pass filter process) of the digital value DQ, and output the digital value DQ on which the filter process has been performed. It should be noted that it is also possible for the time-to-digital conversion circuit 20 to perform the time-to-digital conversion using three or more clock signals different in clock frequency from each other. For example, it is possible to input a third clock signal in addition to the first and second clock signal to convert the time difference in transition timing between the signal STA and the signal STP into the digital value DQ.

The PLL circuit 120 (a synchronizing circuit in a broad sense) performs phase synchronization between the clock signal CK1 and the clock signal CK2. For example, the PLL circuit 120 phase-synchronizes the clock signals CK1, CK2 with each other at every phase synchronization timing (every given timing). Specifically, the PLL circuit 120 performs the phase synchronization for making the transition timings of the clock signals CK1, CK2 coincide with each other at every phase synchronization timing. A specific configuration example of the PLL circuit 120 will be described later.

After the phase synchronization timing between the clock signals CK1, CK2, the time-to-digital conversion circuit 20 makes the transition of the signal level of the signal STA based on the clock signal CK1. For example, the phase synchronization between the clock signals CK1, CK2 by the PLL circuit 120 is performed, and after this phase synchronization timing, the time-to-digital conversion circuit 20 makes the transition of the signal level of the signal STA using the clock signal CK1. For example, the time-to-digital conversion circuit 20 makes the transition of the signal level from the first voltage level (e.g., an L level) to a second voltage level (e.g., an H level). Specifically, the time-to-digital conversion circuit 20 generates the signal STA as a pulse signal.

Then, the time-to-digital conversion circuit 20 performs the phase comparison between the signal STP, which makes the transition in the signal level in accordance with the signal STA, and the clock signal CK2 to thereby obtain the digital value DQ corresponding to the time difference. For example, due to the phase comparison, the time-to-digital conversion circuit 20 determines the timing at which the anteroposterior relationship in the phase between the signal STP and the clock signal CK2 is reversed to obtain the digital value DQ. The timing at which the anteroposterior relationship in the phase is reversed is the timing at which the state in which one of the signal STP and the clock signal CK2 lags in phase behind the other is switched to the state in which the one of the signals leads in phase over the other. The phase comparison between the signal STP and the clock signal CK2 can be realized by, for example, sampling one of the signal STP and the clock signal CK2 based on the other.

As described above, in the present embodiment, the phase synchronization between the clock signals CK1, CK2 is performed by the PLL circuit 120, and after the timing of the phase synchronization, the signal STA is generated based on the clock signal CK1. Then, the phase comparison between the signal STP, the signal level of which makes the transition in accordance with the signal STA thus generated, and the clock signal CK2 is performed to thereby obtain the digital value DQ corresponding to the time difference in transition timing between the signal STA and the signal STP. By adopting this process, it becomes possible to realize the high-performance (high-accuracy, high-resolution) time-to-digital conversion while autonomously generating the first signal used for the time-to-digital conversion.

Further, in the present embodiment, by providing the PLL circuit 120 to the circuit device 10, it becomes possible to match the transition timings of the clock signals CK1, CK2 with each other at every phase synchronization timing. Therefore, since it becomes possible to start the circuit processing using the phase synchronization timing as the reference timing, simplification of the circuit processing and the circuit configuration can be achieved. Further, it becomes possible to start the process of the time-to-digital conversion immediately after the phase synchronization timing due to the PLL circuit 120 without waiting for the incidental matching of the transition timings of the clock signals CK1, CK2. Therefore, speeding-up of the time-to-digital conversion can be achieved. Further, by providing the PLL circuit 120, the error caused by the time difference in transition timing between the clock signals CK1, CK2 at the phase synchronization timing can be minimized. Therefore, it becomes possible to achieve an increase in accuracy by sufficiently reducing the error, which is generated due to the time difference in a systematic manner.

For example, in the related art method of Document 4 described above, the matching of the edges of the first and second clock pulses is detected by the edge matching detection circuit, and the time measurement is started subject to the detection of the matching of the edges. However, according to the related art method, since the time measurement cannot be started unless matching of the edges of the first and second clock pulses is detected, there is a first problem that the start of the time measurement is delayed, and the conversion time of the time-to-digital conversion increases. Further, in the case in which the relationship in clock frequency between the first and second clock pulses is in the frequency relationship in which the edges fail to match each other at the synchronization point, there is a second problem that the edges can only match each other by chance, and it becomes difficult to realize the time-to-digital conversion. Further, since the timing of the synchronization point of the first and second clock pulses cannot be decided in a systematic manner, there is a third problem that the circuit processing and the circuit configuration become complicated. Further, in the case in which an error exists in the matching detection of the edges of the first and second clock pulses, there is a fourth problem that the accuracy degrades due to the error.

In contrast, in the present embodiment, by providing the PLL circuit 120, it becomes possible to forcibly match the transition timings of the clock signals CK1, CK2 with each other at every phase synchronization timing. Therefore, since it is possible to start the time-to-digital conversion process immediately after the phase synchronization timing, the first problem described above of the related art can be resolved. Further, according to the present embodiment, even in the case in which the frequency relationship in clock frequency between the clock signals CK1, CK2 is the frequency relationship in which the transition timings do not coincide with each other, the transition timings of the clock signals CK1, CK2 are forcibly made to coincide with each other at every phase synchronization timing due to the PLL circuit 120. Therefore, the second problem of the related art method can be resolved. Further, since the phase synchronization timing can be decided in a systematic manner due to the phase synchronization by the PLL circuit 120, the circuit process and the circuit device can be simplified, and thus, the third problem of the related art method can be resolved. Further, since the transition timings of the clock signals CK1, CK2 coincide with each other at every phase synchronization timing, the conversion error caused by the difference in transition timing between the clock signals CK1, CK2 can be reduced, and thus, the fourth problem of the related art method can also be resolved.

The oscillation circuits 101, 102 are circuits for oscillating the resonators XTAL1, XTAL2. For example, the oscillation circuit 101 (a first oscillation circuit) oscillates the resonator XTAL1 (a first resonator) to generate the clock signal CK1 with the clock frequency f1. The oscillation circuit 102 (a second oscillation circuit) oscillates the resonator XTAL2 (a second resonator) to generate the clock signal CK2 with the clock frequency f2. For example, the clock frequencies have a relationship of f1>f2.

The resonators XTAL1, XTAL2 are each, for example, a piezoelectric resonator. Specifically, the resonators XTAL1, XTAL2 are each, for example, a quartz crystal resonator. The resonators XTAL1, XTAL2 are each a quartz crystal resonator of a thickness-shear vibration type such as an AT-cut type or an SC-cut type. For example, the resonators XTAL1, XTAL2 each can also be a resonator of a simple-package type (SPXO), an oven type (OCXO) provided with a thermostatic oven, or can also be a resonator of a temperature compensation type (TCXO) not provided with the thermostatic oven. Further, as the resonators XTAL1, XTAL2, it is also possible to adopt a surface acoustic wave (SAW) resonator, an MEMS (micro electromechanical systems) resonator as a resonator made of silicon, and so on.

As described above, in FIG. 1, the clock signal CK1 is a clock signal generated using the resonator XTAL1, and the clock signal CK2 is a clock signal generated using the resonator XTAL2. By using the clock signal generated by the resonator as described above, it is possible to achieve an improvement in accuracy of the time-to-digital conversion and so on compared to the method not using the resonator. It should be noted that the present embodiment is not limited to this configuration, but it is sufficient for the clock signals CK1, CK2 to be different in clock frequency from each other, and it is also possible to use clock signals from resonators each having an oscillation circuit and an resonator housed in a package.

Figure 2:
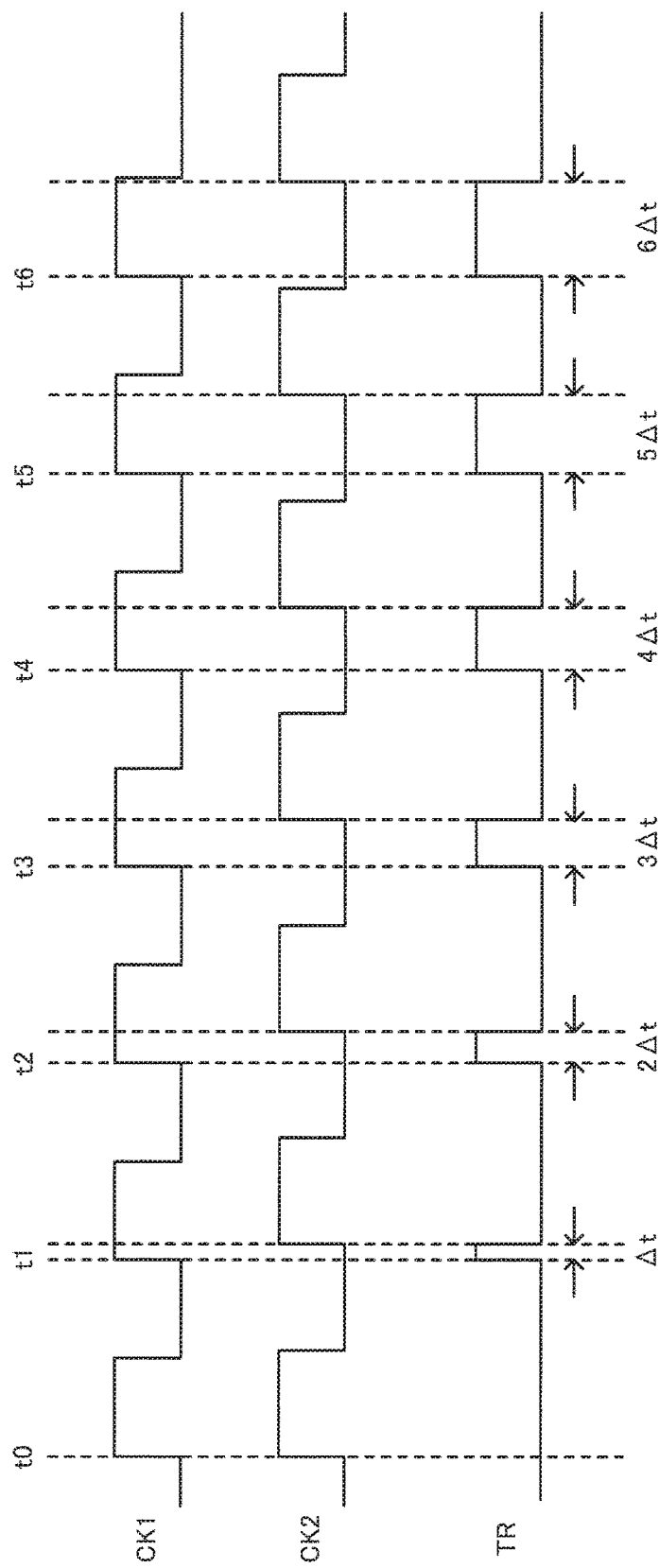
FIG. 2 is an explanatory diagram of a time-to-digital conversion method using a clock frequency difference.

FIG. 2 is an explanatory diagram of the time-to-digital conversion method using a clock frequency difference. At t0, the clock signals CK1, CK2 coincide in transition timing (phase) with each other. Subsequently, at t1, t2, t3, . . . , an inter-clock time difference TR (phase difference), which is a time difference in the transition timing between the clock signals CK1, CK2, increases monotonically like Δt, 2Δt, 3Δt, . . . . In FIG. 2, the inter-clock time difference is represented by a pulse signal with a width of TR.

Further, in the time-to-digital conversion of the present embodiment, there is used, for example, a plurality of resonators to convert the time into a digital value DQ using the clock frequency difference. Specifically, in the case of defining the clock frequencies of the clock signals CK1, CK2 respectively as f1, f2, the time-to-digital conversion circuit converts the time into the digital value DQ with the resolution corresponding to the frequency difference |f1−f2| between the clock frequencies f1, f2. For example, as shown in FIG. 2, the time-to-digital conversion circuit 20 converts the time into the digital value DQ using the principles of a vernier caliper.

By adopting this process, it becomes possible to set the resolution of the time-to-digital conversion using the frequency difference |f1-f2| between the clock frequencies f1, f2, and the improvement in performance such as accuracy and resolution of the time-to-digital conversion becomes possible.

Specifically, the resolution (time resolution) Δt of the time-to-digital conversion of the present embodiment can be expressed as follows.

$$\Delta t = |1/f1 - 1/f2| = |f1 - f2|/(f1 \times f2)$$

Further, the time-to-digital conversion circuit 20 converts the time into the digital value DQ with the resolution Δt expressed as follows.

$$\Delta t = |1/f1 - 1/f2| = |f1 - f2|/(f1 \times f2)$$

The resolution Δt is expressed as follows, and corresponds to the frequency difference |f1−f2|.

$$\Delta t=|f1-f2|/(f1 \times f2)$$

By adopting this process, it becomes possible to set the resolution of the time-to-digital conversion by setting the clock frequencies f1, f2. For example, by decreasing the frequency difference |f1−f2| between the clock frequencies f1, f2, the resolution Δt can be made finer, and it becomes possible to realize the time-to-digital conversion high in resolution. Further, by setting the clock frequencies f1, f2 to high frequencies, the resolution Δt can be made finer, and it becomes possible to realize the time-to-digital conversion high in resolution. Further, by generating the clock signals CK1, CK2 with the clock frequencies f1, f2 using the resonators XTAL1, XTAL2, it becomes possible to achieve an improvement in accuracy of the time-to-digital conversion compared to the case of using a delay element as a semiconductor element.

Figure 3:
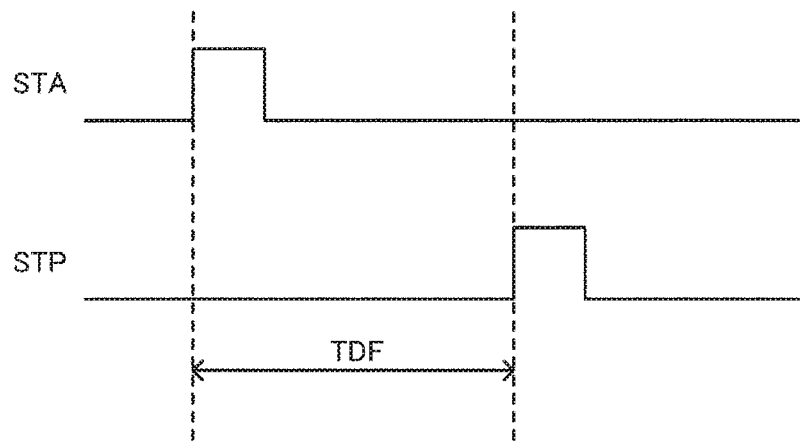
FIG. 3 is a diagram showing a relationship between signals STA, STP.

FIG. 3 is a diagram showing a relationship between the signal STA (the first signal, the start signal) and the signal STP (the second signal, the stop signal). The time-to-digital conversion circuit 20 of the present embodiment converts the time difference TDF in transition timing between the signal STA and the signal STP into a digital value. It should be noted that although in FIG. 3, TDF is defined as the time difference between (between the rising edges) the transition timings of the rising edges of the signal STA and the signal STP, but can also be defined as the time difference between (between the falling edges) the transition timings of the falling edges of the signal STA and the signal STP.

Figure 4:
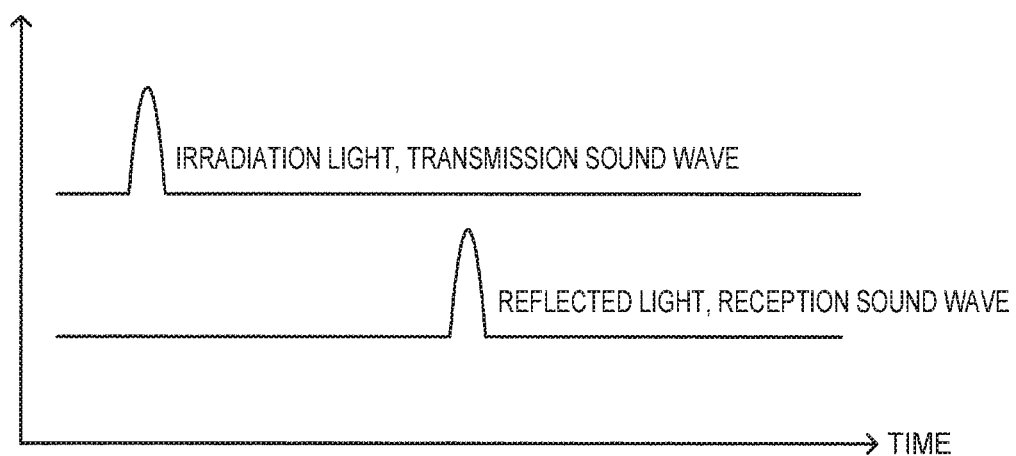
FIG. 4 is a diagram showing an example of physical quantity measurement using the signals STA, STP.

FIG. 4 is a diagram showing an example of physical quantity measurement using the signals STA, STP. For example, the physical quantity measurement device including the circuit device 10 according to the present embodiment emits the irradiation light (e.g., a laser beam) to an object (e.g., an object in the periphery of a car) using the signal STA. Then, the signal STP is generated due to the reception of the reflected light from the object. For example, the physical quantity measurement device performs waveform shaping on the light reception signal to thereby generate the signal STP. According to this process, by converting the time difference TDF in transition timing between the signal STA and the signal STP into a digital value, the distance from the object can be measured as a physical quantity using, for example, a time-of-flight (TOF) method, and can be used for, for example, automated driving of a car.

Alternatively, the physical quantity measurement device transmits a transmission sound wave (e.g., an ultrasonic wave) to an object (e.g., a living body) using the signal STA. Then, the signal STP is generated due to the reception of the reception sound wave from the object. For example, the physical quantity measurement device performs waveform shaping on the reception sound wave to thereby generate the signal STP. According to this process, by converting the time difference TDF in the transition timing between the signal STA and the signal STP into a digital value, the distance from the object and so on can be measured, and the measurement of biological information and so on with an ultrasonic wave becomes possible.

It should be noted that in FIG. 3 and FIG. 4, it is also possible to measure the time from when the transmission data is transmitted to when the reception data is received by transmitting the transmission data with the signal STA, and using the signal STP due to the reception of the reception data. Further, the physical quantity measured by the physical quantity measurement device according to the present embodiment is not limited to time and the distance, but a variety of physical quantities such as a flow rate, flow speed, a frequency, speed, acceleration, angular velocity, and angular acceleration are conceivable.

2. First Configuration Example

Figure 5:
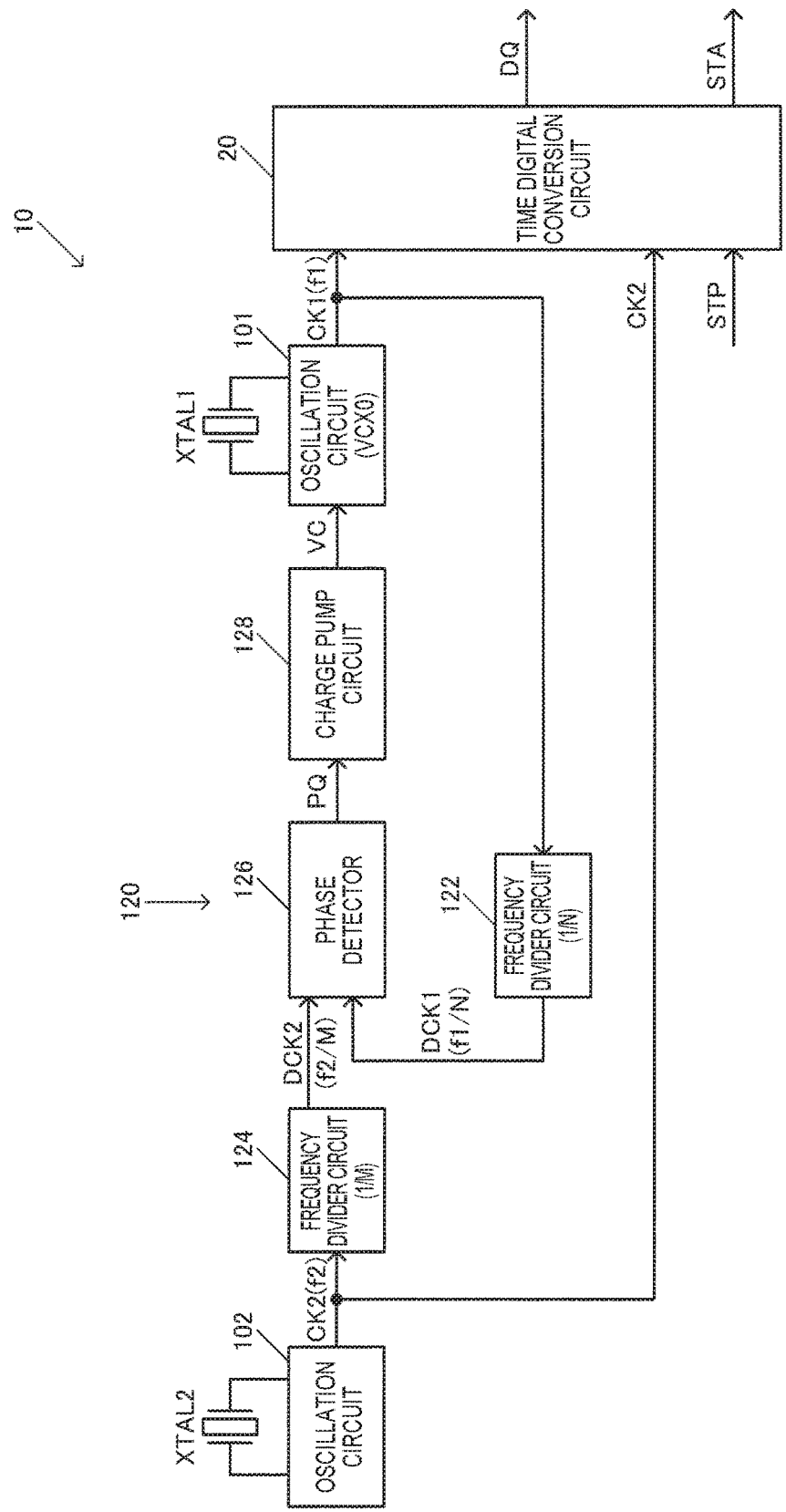
FIG. 5 is a diagram showing a detailed first configuration example of the circuit device according to the embodiment.

FIG. 5 shows a detailed first configuration example of the circuit device 10 according to the present embodiment. FIG. 5 shows a specific configuration example of the PLL circuit 120.

The PLL circuit 120 shown in FIG. 5 includes frequency divider circuits 122, 124 (first and second frequency divider circuits) and a phase detector 126. The frequency divider circuit 122 divides the frequency of the clock signal CK1 to output a frequency-divided clock signal DCK1 (a first frequency-divided clock signal). Specifically, the frequency divider circuit 122 performs frequency division of reducing the clock frequency f1 of the clock signal CK1 to 1/N to output the frequency-divided clock signal DCK1 having a clock frequency of f1/N.

The frequency divider circuit 124 divides the frequency of the clock signal CK2 to output a frequency-divided clock signal DCK2 (a second frequency-divided clock signal). Specifically, the frequency divider circuit 124 performs frequency division of reducing the clock frequency f2 of the clock signal CK2 to 1/M to output the frequency-divided clock signal DCK2 having a clock frequency of f1/M. For example, the circuit device 10 includes the oscillator 102, and the oscillator 102 oscillates the resonator XTAL2 to generate the clock signal CK2, and then outputs the clock signal CK2 to the frequency divider circuit 124. Then, the phase detector 126 performs phase comparison between the frequency-divided clock signal DCK1 and the frequency-divided clock signal DCK2.

Specifically, the frequency divider circuit 122 has a counter for the frequency division for performing the counting operation of the count value based on the clock signal CK1, and the counter is reset when the count value reaches, for example, N. The frequency divider circuit 124 has a counter for the frequency division for performing the counting operation of the count value based on the clock signal CK2, and the counter is reset when the count value reaches, for example, M.

Further, the circuit device 10 includes the oscillation circuit 101. The oscillation circuit 101 is controlled based on the phase comparison result of the phase detector 126 of the PLL circuit 120, and oscillates the resonator XTAL1. The oscillation circuit 101 is also a constituent of, for example, the PLL circuit 120. Specifically, the oscillation circuit 101 is, for example, a voltage-controlled oscillation circuit (VCXO) the oscillation frequency of which is controlled using voltage control.

Figure 9:
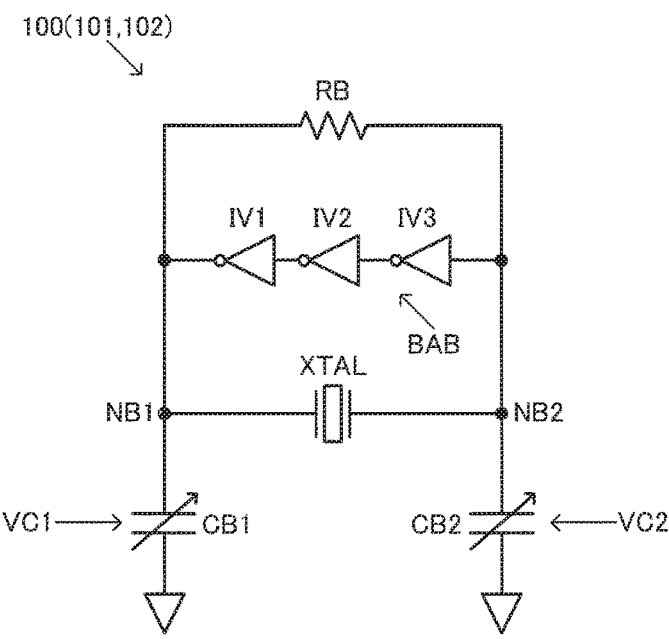
FIG. 9 is a diagram showing a first configuration example of an oscillation circuit.
Figure 10:
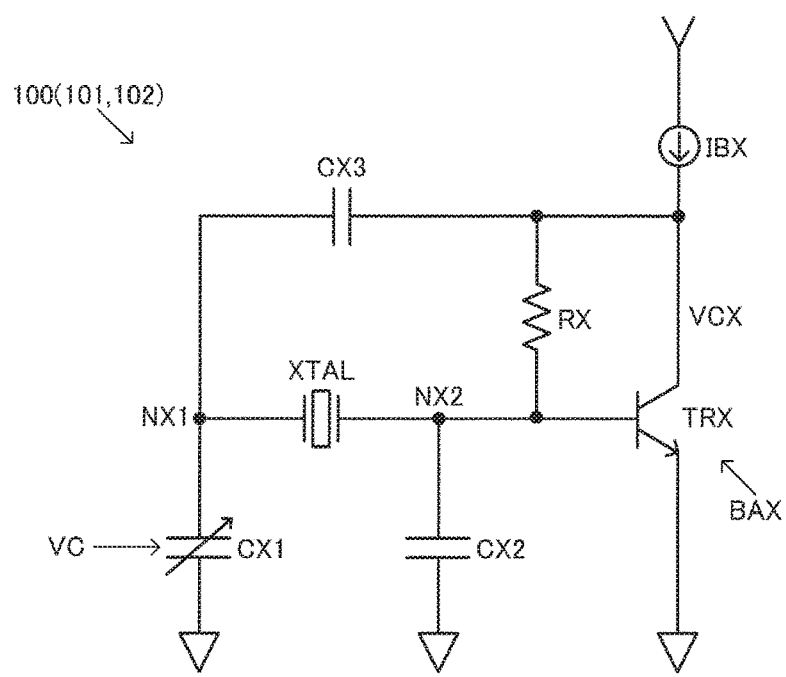
FIG. 10 is a diagram showing a second configuration example of the oscillation circuit.

Then, the PLL circuit 120 includes a charge pump circuit 128, and the phase detector 126 outputs a signal PQ as the phase comparison result to the charge pump circuit 128. The signal PQ is, for example, an up/down signal, and the charge pump 128 outputs a control voltage VC based on the signal PQ to the oscillation circuit 101. The charge pump circuit 128 includes a loop filter (alternatively, the loop filter is disposed in a posterior stage of the charge pump circuit 128), and the loop filter converts the up/down signal as the signal PQ into the control voltage VC. The oscillation circuit 101 performs the oscillation operation of the resonator XTAL1, the oscillation frequency of which is controlled based on the control voltage VC, to generate the clock signal CK1. For example, as shown in FIG. 9 and FIG. 10, the oscillation circuit 101 has a variable capacitance circuits (CB1, CB2, CX1), and the capacitance values of the variable capacitance circuits are controlled based on the control voltage VC (VC1, VC2) to thereby control the oscillation frequency.

Specifically, the phase detector 126 outputs an up signal as the signal PQ in the case in which the phase of the frequency-divided clock signal DCK1 as a feedback signal lags in phase behind the frequency-divided clock signal DCK2 as a reference signal. In contrast, in the case in which the frequency-divided clock signal CK1 leads in phase over the frequency-divided clock signal DCK2, the phase detector 126 outputs a down signal as the signal PQ.

For example, the charge pump circuit 128 for performing the charge pump operation includes an up-transistor and a down-transistor connected in series between VDD (a high potential side power supply voltage) and VSS (a low potential side power supply voltage). Further, when the up signal is activated, the up-transistor is set to an ON state. Thus, a charge operation of the capacitor provided to the loop filter is performed, and the control voltage VC is changed to the VDD side. When the control voltage VC changes to the VDD side, the oscillation frequency of the oscillation circuit 101 changes to the high frequency side, and the clock frequency f1 of the clock signal CK1 also changes to the high frequency side. On the other hand, when the down signal is activated, the down-transistor is set to the ON state. Thus, a discharge operation of the capacitor provided to the loop filter is performed, and the control voltage VC is changed to the VSS side. When the control voltage VC changes to the VSS side, the oscillation frequency of the oscillation circuit 101 changes to the low frequency side, and the clock frequency f1 of the clock signal CK1 also changes to the low frequency side.

Figure 6:
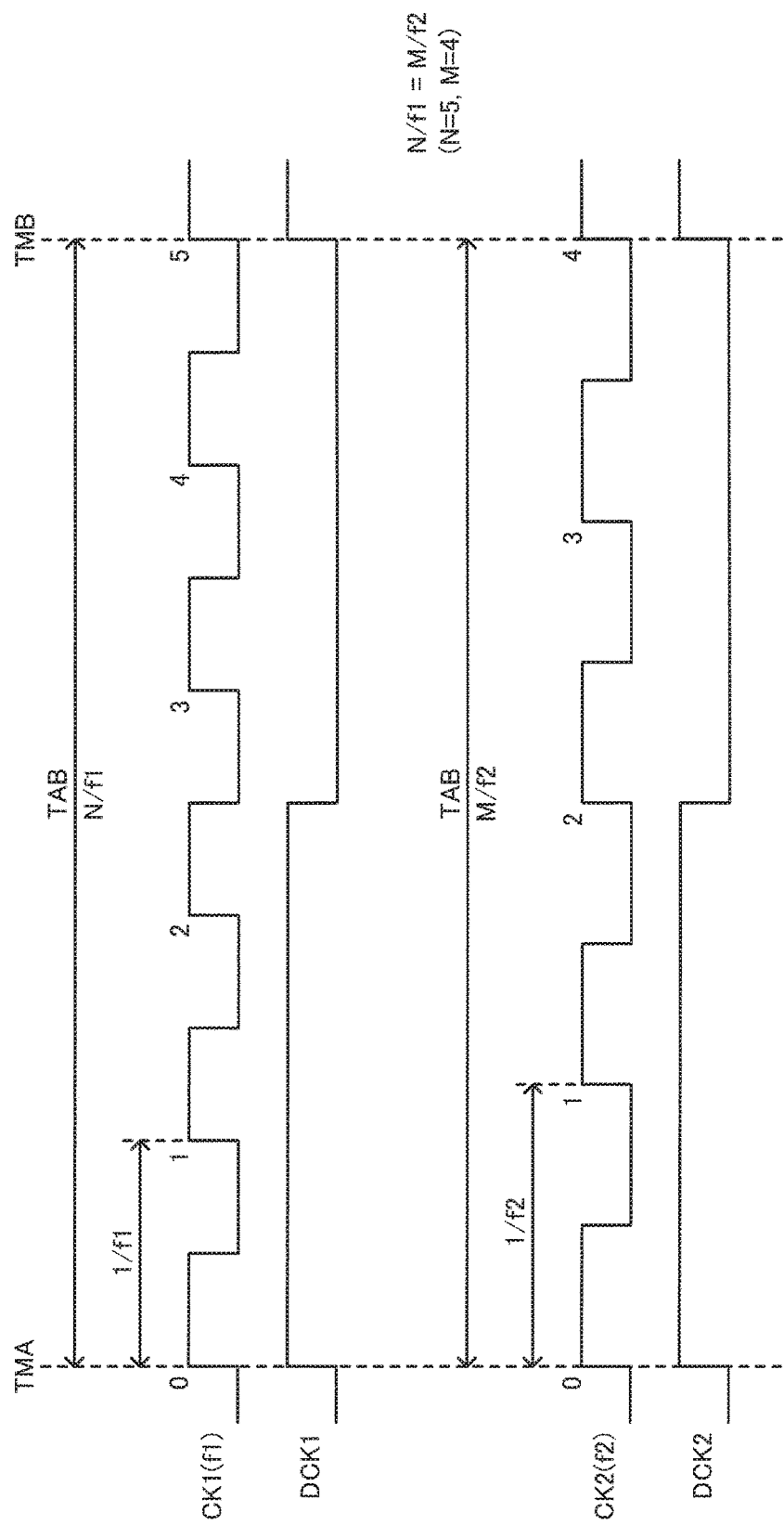
FIG. 6 is a signal waveform chart for explaining an operation of the circuit device.

FIG. 6 is a signal waveform chart for explaining the operation of the circuit device 10 according to the present embodiment. FIG. 6 shows the case in which the phase synchronization between the clock signals CK1, CK2 is achieved by the PLL circuit 120, and the PLL circuit 120 is in a locked state. It should be noted that although in FIG. 6, there is shown an example in which N=5, M=4 are set for the sake of simplification of the explanation, in reality, in order to increase the resolution of the time-to-digital conversion, N and M are set to be extremely large values.

As shown in FIG. 6, the signal obtained by dividing the clock signal CK1 in frequency by N=5 becomes the frequency-divided clock signal DCK1. Further, the signal obtained by dividing the clock signal CK2 in frequency by M=4 becomes the frequency-divided clock signal DCK2. As described above, the phase detector 126 performs the phase comparison between the frequency-divided clock signals DCK1, DCK2, and the feedback control for controlling the oscillation frequency of the oscillation circuit 101 is performed based on the phase comparison result. Thus, the transition timings (the rising edges) of the frequency-divided clock signals DCK1, DCK2 become to coincide (roughly coincide) with each other at the phase synchronization timings TMA, TMB, and the transition timings of the clock signals CK1, CK2 also become to coincide (roughly coincide) with each other.

For example, in FIG. 6, the period (the period between the first and second phase synchronization timings) between the phase synchronization timings TMA, TMB is defined as TAB. The length of the time of 1 clock cycle of the clock signal CK1 with the clock frequency f1 is 1/f1. Further, the PLL circuit 120 performs the feedback control so that the transition timings of the frequency-divided clock signals DCK1, DCK2 coincide with each other at the phase synchronization timings TMA, TMB. Thus, the length of the period TAB becomes N/f1, which is a length corresponding to N clock cycles of the clock signal CK1. Further, the length of the time of 1 clock cycle of the clock signal CK2 with the clock frequency f2 is 1/f2. Further, the PLL circuit 120 performs the feedback control so that the transition timings of the frequency-divided clock signals DCK1, DCK2 coincide with each other at the phase synchronization timings TMA, TMB. Therefore, the length of the period TAB becomes M/f2, which is a length corresponding to M clock cycles of the clock signal CK2. In other words, the PLL circuit 120 having the configuration shown in FIG. 5 performs the phase synchronization between the clock signals CK1, CK2 so that the relationship of N/f1=M/f2 becomes true.

Figure 7:
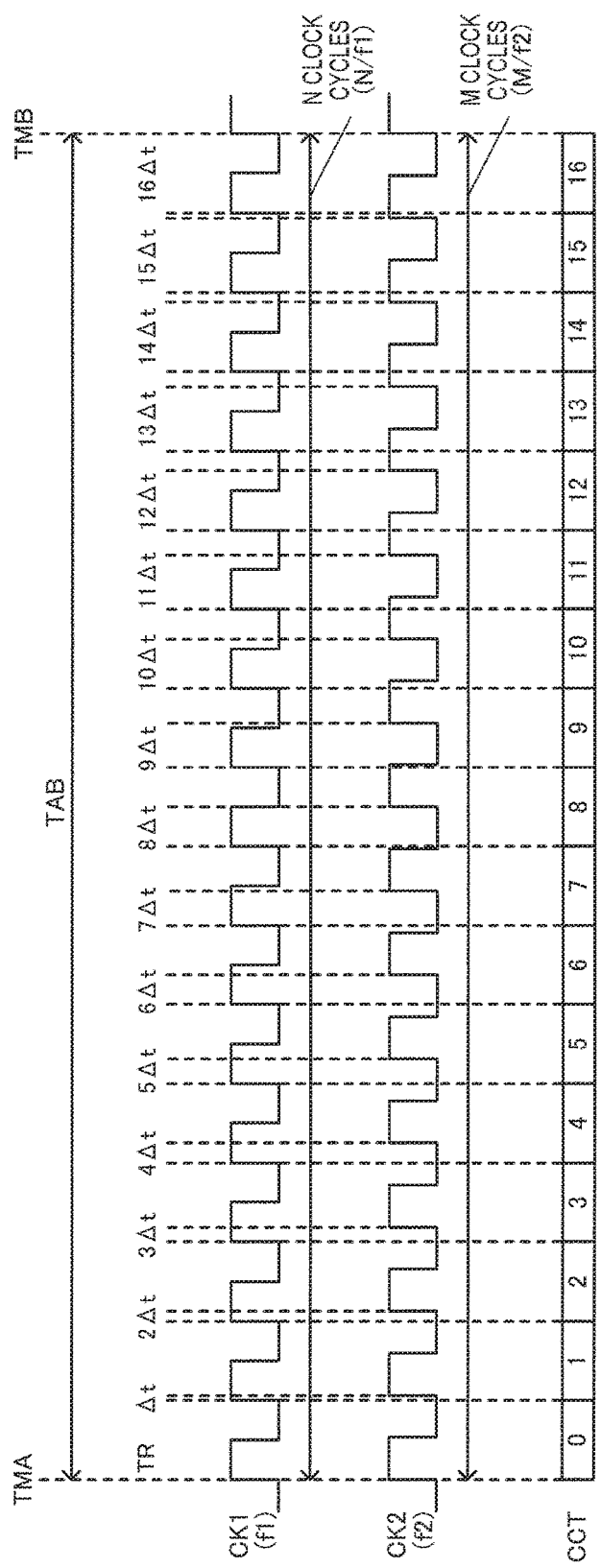
FIG. 7 is a signal waveform chart for explaining a detailed operation of the circuit device.

FIG. 7 is a signal waveform chart for explaining the detailed operation of the circuit device 10 according to the present embodiment. In FIG. 7, at the phase synchronization timing TMA, the phase synchronization by the PLL circuit 120 is achieved, and thus, the transition timings of the clock signals CK1, CK2 coincide with each other. Subsequently, as described with reference to FIG. 2, the time difference in transition timing between the clock signals CK1, CK2 continues to increase by $\Delta t$ at every clock cycle (CCT) in such a manner as $\Delta t$, $2\Delta t$, $3\Delta t$, . . . . Then, at the phase synchronization timing TMB, the phase synchronization by the PLL circuit 120 is achieved, and thus, the transition timings of the clock signals CK1, CK2 coincide with each other.

As shown in FIG. 7, the length of the period TAB between the phase synchronization timings TMA, TMB is made to correspond to N clock cycles of the clock signal CK1. Further, the length of the period TAB is made to correspond to M clock cycles of the clock signal CK2. Here, N, M are integers different from each other and each equal to or greater than 2. For example, in FIG. 7, N=17 and M=16 are assumed, and N−M=1 is set.

For example, in the case of denoting the length of the period TAB by the same symbol of TAB, TAB=N/f1=M/f2 is assumed in FIG. 7. In other words, between the clock frequencies f1, f2, there is fulfilled the relationship of N/f1=M/f2. For example, if the clock frequency f2 as the reference frequency is assumed as f2=16 MHz, and N=17, M=16 are set, f1=17 MHz is obtained, and the relational expression of N/f1=M/f2 is true. Further, it is possible to make the clock signals CK1, CK2 coincide in transition timing with each other at the timings of TMA, TMB.

By adopting this configuration, as shown in FIG. 7, the inter-clock time difference TR between the clock signals CK1, CK2 becomes to increase by $\Delta t$ in such a manner as $\Delta t$, $2\Delta t$, $3\Delta t$, . . . after the clock signals CK1, CK2 coincide in transition timing with each other at the phase synchronization timing TMA. Therefore, it is possible to create the inter-clock time difference TR between the clock signals CK1, CK2 continues to increase by $\Delta t$ at every clock cycle after the phase synchronization timing TMA. Then, at the subsequent phase synchronization timing TMB, the transition timings of the clock signals CK1, CK2 coincide with each other, and thus the inter-clock time difference TR becomes zero. Subsequently, the inter-clock time difference TR becomes to increase by $\Delta t$ at every clock cycle.

As described above, by creating the inter-clock time difference TR vanishing at the phase synchronization timing, and then continuing to increase by $\Delta t$ (the resolution) using the phase synchronization by the PLL circuit 120, it becomes possible to realize the process of the time-to-digital conversion (a repeating method, an updating method, and a binary method) described later. In other words, it is possible to realize the time-to-digital conversion for converting the time into the digital value with the resolution of Δt. Further, in such a process of the time-to-digital conversion with the resolution of Δt, since the inter-clock time difference TR in each clock cycle (CCT) in the period TAB can uniquely be identified as shown in FIG. 7, it is possible to achieve simplification of the process and the circuit configuration of the time-to-digital conversion. Further, due to the phase synchronization by the PLL circuit 120, since it is possible to make the transition timings of the clock signals CK1, CK2 coincide (roughly coincide) with each other at the phase synchronization timings TMA, TMB, it becomes possible to achieve an improvement in the accuracy of the time-to-digital conversion.

For example, as the method of a comparative example of the present embodiment, a method of setting a design clock frequency so that the relationship of N/f1=M/f2 is true without performing the phase synchronization using the PLL circuit 120 is conceivable. For example, in the related art method of Document 4 described above, the method of making the relationship of N/f1=M/f2 true as the relationship of the design clock frequencies of the first and second quartz crystal resonators is conceivable.

However, in the related art method described above, the first and second quartz crystal resonators each perform a free-running oscillation operation in which the oscillation operation is not controlled. Therefore, even if the relationship of N/f1=M/f2 is true, it is difficult to make the transition timings of the clock signals CK1, CK2 coincide with each other at the phase synchronization timings. For example, since the first and second quartz crystal resonators are different in start-up timing of the oscillation from each other, in the method according to the comparative example in which such phase synchronization as in the present embodiment is not performed, it is not possible to make the transition timings of the clock signals CK1, CK2 coincide with each other at the phase synchronization timings. Further, the clock frequency by the first and second quartz crystal resonators varies due to a manufacturing variation or an environmental variation such as a temperature variation. Therefore, even if the relationship of N/f1=M/f2 is made true at the design phase, the relationship of N/f1=M/f2 becomes no longer true in the actual product. Therefore, a shift or the like occurs in the transition timing, and therefore, the conversion accuracy of the time-to-digital conversion degrades.

In contrast, in the present embodiment, even in the case in which the variation of the clock frequency due to the manufacturing variation or the environmental variation occurs, the PLL circuit 120 adjusts the oscillation frequency of the oscillation circuit 101 based on the control voltage VC, and thus, the clock frequency f1 is adjusted so that the variation is compensated. Therefore, even in the case in which such a variation of the clock frequency occurs, it becomes possible to make the relationship of N/f1=M/f2 true, and thus, it becomes possible to realize appropriate time-to-digital conversion. Further, as shown in FIG. 7, since it is possible to make the transition timings of the clock signals CK1, CK2 coincide with each other at the phase synchronization timings TMA, TMB, it becomes possible to prevent the degradation of the conversion accuracy due to the shift of the transition timing to thereby achieve an improvement in the performance of the time-to-digital conversion.

As described above, in the present embodiment, in the case of assuming the clock frequencies of the clock signals CK1, CK2 as f1, f2, the PLL circuit 120 performs the phase synchronization between the clock signals CK1, CK2 so as to fulfill N/f1=M/f2. In other words, the phase synchronization is performed so that the relationship of N/f1=M/f2 becomes true.

By adopting this configuration, as shown in FIG. 6 and FIG. 7, the phase synchronization in every period TAB between the phase synchronization timings TMA, TMB becomes possible. Specifically, it becomes possible to perform the phase synchronization, in which the length of the period TAB between the phase synchronization timings TMA, TMB becomes the length corresponding to N clock cycles of the clock signal CK1, and at the same time the length corresponding to M clock cycles of the clock signal CK2. Here, N, M are integers different from each other and each equal to or greater than 2. In FIGS. 6, N=5 and M=4 are assumed, and N−M=1 is set. In FIG. 7, N=17 and M=16 are assumed, and N−M=1 is set. By adopting this configuration, the phase synchronization at an appropriate timing becomes possible, and it is possible to prevent occurrence of a trouble caused by the phase synchronization at inappropriate phase synchronization timing, and so on. Specifically, in the repeating method of the signal STA explained with reference to FIG. 13 and FIG. 14 described above, the time-to-digital conversion defining the period TAB as the measurement period (TS) becomes possible. Further, in the updating method of the clock cycle designation value and the binary search method explained with reference to FIG. 15 through FIG. 18 described later, the time-to-digital conversion defining the period TAB as the updating period (TP, TP1 through TP4) becomes possible. Therefore, the time-to-digital conversion defining the period TAB as the processing period becomes possible, the it becomes possible to achieve simplification of the processing sequence and the circuit configuration.

Further, in the case of assuming the resolution of the time-to-digital conversion as Δt, the PLL circuit 120 performs the phase synchronization between the clock signals CK1, CK2 so as to fulfill the following expression.

$$\Delta t=|N-M|/(N \times f2)=|N-M|/(M \times f1)$$

In other words, in FIG. 6 and FIG. 7, the PLL circuit 120 performs the phase synchronization so that the relational expression of N/f1=M/f2 becomes true. Further, as described with reference to FIG. 2 and FIG. 7, the resolution Δt of the time-to-digital conversion of the present embodiment can be expressed as the following relational expression.

$$\Delta t=|f1-f2|/(f1 \times f2)$$

Therefore, based on these two relational expressions, Formula (1) below becomes true.

$$\Delta t=|N-M|/(N \times f2)=|N-M|/(M \times f1) \quad (1)$$

By adopting this configuration, it becomes possible to set the values N, M and so on in accordance with the resolution Δt required for the time-to-digital conversion, and achieve the phase synchronization between the clock signals CK1, CK2.

For example, it is assumed that the resolution of Δt=2 ns (nanoseconds) is required as the resolution of the time-to-digital conversion. Further, it is assumed that the clock frequency of the clock signal CK2 as the reference signal is f2=100 MHz. In this case, by setting N=5, and M=4 in Formula (1), the time-to-digital conversion with the following resolution can be realized.

$$\Delta t=|5-4|/(5 \times f2)=2ns$$

In this case, from the relational expression of N/f1=M/f2, the clock frequency f1 of the clock signal CK1 is obtained as follows.

$$f1=(N/M)\times f2=125 \text{ MHz}$$

Specifically, in FIG. 5, the frequency division ratios of the frequency divider circuits 122, 124 are set to N=5, M=4, and the oscillator circuit 101 adjusts the clock frequency f1 of the clock signal CK1 based on the control voltage VC so as to achieve f1=125 MHz as a result.

Further, it is assumed that the resolution of Δt=1 ps (picosecond) is required as the resolution of the time-to-digital conversion. Further, it is assumed that the clock frequency of the clock signal CK2 is f2=122.865 MHz. In this case, by setting N=8139, and M=8138 in Formula (1), the time-to-digital conversion with the following resolution can be realized.

$$\Delta t=|8139-8138|/(8139\times f2)=1 \text{ ps}$$

In this case, from the relational expression of N/f1=M/f2, the clock frequency f1 of the clock signal CK1 is obtained as follows.

$$f1=(N/M)\times f2=122.880 \text{ MHz}$$

Specifically, the frequency division ratios of the frequency divider circuits 122, 124 are set to N=8139, M=8138, and the oscillator circuit 101 adjusts the clock frequency f1 of the clock signal CK1 based on the control voltage VC so as to achieve f1=122.880 MHz as a result.

The magnitude relation between the clock frequencies f1, f2 is not limited to f1>f2, but cam also be f1<f2. For example, it is also possible for the clock signal with a higher frequency to be the reference signal in the PLL circuit 120. Further, in FIG. 5, it is arranged that the relationship of N/f1=M/f2 is satisfied due to the frequency division operation by the frequency divider circuits 122, 124, but the present embodiment is not limited to this configuration. For example, it is also possible to realize the above with the circuit operation for achieving the frequency ratio of f1/f2=N/M. For example, the relationship of f1/f2=N/M can be realized by the PLL circuit 120 of a fractional division type.

Figure 8:
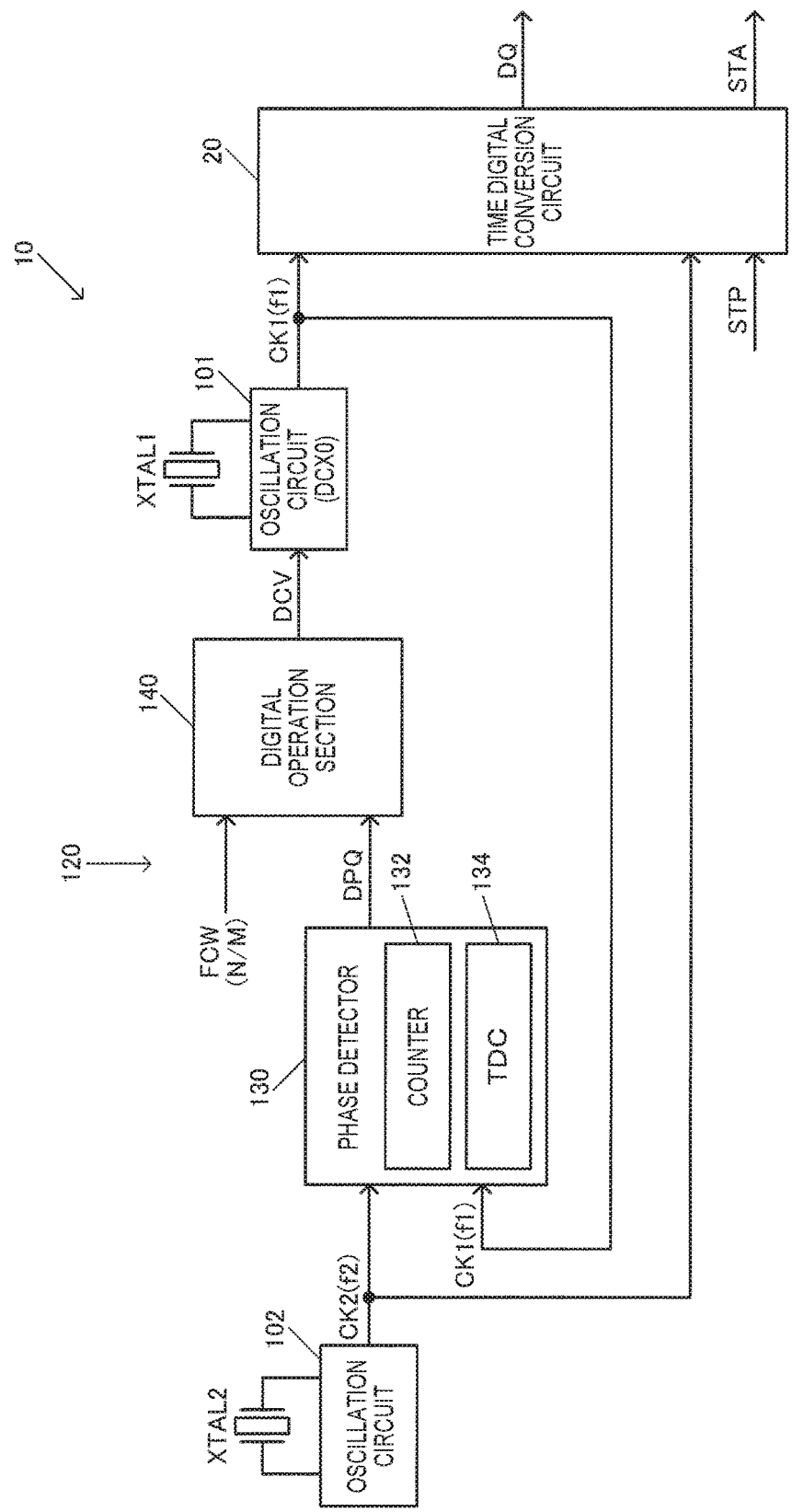
FIG. 8 is a diagram showing a detailed second configuration example of the circuit device according to the embodiment.

Further, the PLL circuit 120 according to the present embodiment includes the phase detector 126 (130) for performing the phase comparison between the clock signal CK1 or a signal based on the clock signal CK1, and the clock signal CK2 or a signal based on the clock signal CK2. For example, the phase detector 126 shown in FIG. 5 performs the phase comparison between the frequency-divided clock signal DCK1 as the signal based on the clock signal CK1, and the frequency-divided clock signal DCK2 as the signal based on the clock signal CK2. The phase detector 130 shown in FIG. 8 described above performs the phase comparison between the clock signal CK1 and the clock signal CK2. Further, the phase detectors 126, 130 each output the signal of the phase comparison result to a circuit in the posterior stage. In FIG. 5, the phase detector 126 outputs the analog signal PQ as the up/down signal to the charge pump circuit 128 in the posterior stage. In FIG. 8 described later, the phase detector 130 outputs the digital data DPQ to a digital operation section 140 in the posterior stage.

By providing such a phase detector 126 (130), by performing the control of feeding back the phase comparison result between the clock signal CK1 or the signal based on the clock signal CK1, and the clock signal CK2 or the signal based on the clock signal CK2, it becomes possible to realize the phase synchronization of making the transition timings of the clock signals CK1, CK2 coincide with each other at the phase synchronization timing.

Further, in FIG. 5, the PLL circuit 120 has the frequency divider circuit 122 for dividing the frequency of the clock signal CK1 to output the frequency-divided clock signal DCK1 to the phase detector 126, and the frequency divider circuit 124 for dividing the frequency of the clock signal CK2 to output the frequency-divided clock signal DCK2 to the phase detector 126.

By providing such frequency divider circuits 122, 124, it becomes possible to perform the control of feeding back the phase comparison result between the frequency-divided clock signals DCK1, DCK2 in the phase detector 126 to realize the phase synchronization between the clock signals CK1, CK2.

Specifically, in FIG. 5, the frequency divider circuit 122 divides the frequency of the clock signal CK1, and the frequency divider circuit 124 divides the frequency of the clock signal CK2 so as to fulfill N/f1=M/f2. For example, the frequency divider circuit 122 performs the frequency division for reducing the clock frequency f1 to 1/N, and the frequency divider circuit 124 performs the frequency division for reducing the clock frequency f2 to 1/M. Further, by performing the feedback control for making the transition timings of the frequency-divided clock signals DCK1, DCK2 obtained by the frequency division coincide with each other, the relationship of N/f1=M/f2 becomes to be fulfilled as shown in FIG. 6 and FIG. 7. Thus, the phase synchronization at an appropriate timing becomes possible, and it is possible to prevent occurrence of a trouble caused by the phase synchronization at inappropriate phase synchronization timing, and so on. Specifically, the process of the time-to-digital conversion defining the period TAB as the processing period becomes possible.

Further, as shown in FIG. 5, the circuit device 10 according to the present embodiment includes the oscillation circuit 101, which is controlled based on the phase comparison result of the phase detector 126, and oscillates the resonator XTAL1 to generate the clock signal CK1. For example, the charge pump circuit 128 performs the charge pump operation based on the signal PQ (the up/down signal) of the phase comparison result from the phase detector 126, and the oscillation circuit 101 generates the clock signal CK1 based on the control voltage VC generated by the charge pump operation.

By adopting this process, it becomes possible to adjust the clock frequency f1 of the clock signal CK1 based on the phase comparison result in the phase detector 126 to thereby realize the phase synchronization between the clock signals CK1, CK2, which satisfies, for example, the relationship of N/f1=M/f2. By realizing such phase synchronization, it becomes possible to achieve the simplification of the process and the circuit configuration of the time-to-digital conversion, and the improvement in performance (e.g., increase in accuracy) of the process of the time-to-digital conversion.

Further, as shown in FIG. 5, the circuit device 10 according to the present embodiment includes the oscillation circuit 102, which oscillates the resonator XTAL2 to generate the clock signal CK2.

By generating the clock signals CK1, CK2 using the resonators XTAL1, XTAL2 as described above, and then performing the time-to-digital conversion using these clock signals CK1, CK2, the improvement in accuracy and so on of the time-to-digital conversion can be achieved. In particular, it becomes possible to significantly improve the accuracy of the time-to-digital conversion compared to the related art method for realizing the time-to-digital conversion using the delay elements as the semiconductor elements.

3. Second Configuration Example

FIG. 8 shows a second configuration example of the circuit device 10 according to the present embodiment. The second configuration example shown in FIG. 8 is different in circuit configuration of the PLL circuit 120 compared to the first configuration example. For example, in contrast to the fact that the PLL circuit 120 shown in FIG. 5 has an analog type circuit configuration, the PLL circuit 120 shown in FIG. 8 has a digital type (ADPLL) circuit configuration.

The PLL circuit 120 shown in FIG. 8 includes the phase detector 130, and the digital operation section 140. Further, the oscillation circuit 101 is formed as a digitally controlled oscillation circuit (DCXO) the oscillation frequency of which is controlled based on the frequency control data DCV.

The phase detector 130 is a circuit for performing the phase comparison between the clock signal CK1 (a feedback signal) from the oscillation circuit 101 and the clock signal CK2 (the reference signal) from the oscillation circuit 102. The phase detector 130 includes a counter 132 and the TDC 134 (time digital converter). The counter 132 generates the digital data corresponding to the integral part of the result obtained by dividing the clock frequency f2 (the reference frequency) of the clock signal CK2 (the reference signal) by the clock frequency f1 of the clock signal CK1. The TDC 134 generates the digital data corresponding to a fractional part of the division result. The data corresponding to the addition result of the integral part and the fractional part is output as the digital data DPQ. Here, the TDC 134 can be constituted by, for example, a plurality of delay elements, a plurality of latch circuits, and a logic circuit for generating the digital data corresponding to the fractional part of the division result based on the output signal of the plurality of latch circuits.

The digital operation section 140 detects the phase error with preset frequency data FCW based on the preset frequency data FCW and the digital data DPQ of the comparison result from the phase detector 130. Then, by performing a smoothing process of the phase error, the digital operation section 140 generates the frequency control data DCV, and then output the frequency control data DCV to the oscillation circuit 101. The oscillation circuit 101 is controlled in oscillation frequency based on the frequency control data DCV to generate the clock signal CK1. Then, the clock signal CK1 thus generated is fed back to the phase detector 130.

In the PLL circuit 120 shown in FIG. 8, the frequency control data DCV is generated so that the relationship of f1=FCW×f2 becomes true, and thus, the oscillation frequency of the oscillation circuit 101 is controlled. Therefore, in order to arrange that the relationship of N/f1=M/f2 is fulfilled as shown in FIG. 6 and FIG. 7 described above, it is sufficient to set the preset frequency data to, for example, FCW=N/M. By adopting this configuration, the frequency control data DCV is generated so as to fulfill FCW=N/M=f1/f2, and thus, the relationship of N/f1=M/f2 becomes to be fulfilled.

It should be noted that the configuration of the PLL circuit 120 of the digital type is not limited to the configuration shown in FIG. 8, but a variety of practical modifications can be adopted. For example, it is also possible to realize the digital type PLL circuit 120 with the configuration using a Bang-Bang type phase detector and PI control instead of using the TDC 134.

4. Oscillation Circuit

FIG. 9 shows a first configuration example of the oscillation circuit 100. Here, on behalf of the oscillation circuits 101, 102, the description of oscillation circuit 100 is used.

The oscillation circuit 100 (101, 102) shown in FIG. 9 includes a buffer circuit BAB for oscillation, the variable capacitance circuits CB1, CB2 (variable capacitors, capacitors in a broad sense), and a feedback resistor RB. The buffer circuit BAB can be configured by one inverter circuit or a plurality of stages (odd stages) of inverter circuits. In FIG. 9, the buffer circuit BAB is constituted by three stages of inverter circuits IV1, IV2, and IV3. The buffer circuit BAB (IV1 through IV3) can also be a circuit capable of the control of enabling/disabling the oscillation, and the control of the current flowing through the buffer circuit BAB.

One end (NB1) and the other end (NB2) of the resonator XTAL are respectively provided with variable capacitance circuits CB1, CB2. Further, between the one end and the other end of the resonator XTAL, there is disposed the feedback resistor RB. The variable capacitance circuits CB1, CB2 are controlled in capacitance value based on the control voltages VC1, VC2 (control signals in a broad sense). The variable capacitance circuits CB1, CB2 are each realized by a variable capacitance diode (varactor) or the like. By controlling the capacitance value in such a manner, it becomes possible to adjust (fine adjust) the oscillation frequency (the clock frequency) of the oscillation circuit 100.

It should be noted that it is also possible to provide the variable capacitance circuit to only either one of the one end and the other end of the resonator XTAL. Further, it is also possible to provide an ordinary capacitor with an invariable capacitance value instead of the variable capacitance circuit.

FIG. 10 shows a second configuration example of the oscillation circuit 100. The oscillation circuit 100 has a current source IBX, a bipolar transistor TRX, a resistor RX, capacitors CX2, CX3, and a variable capacitance circuit CX1 (a variable capacitor). For example, the current source IBX, the bipolar transistor TRX, the resistor RX, and the capacitor CX3 constitute a buffer circuit BAX for the oscillation.

The current source IBX supplies the collector of the bipolar transistor TRX with a bias current. The resistor RX is disposed between the collector and the base of the bipolar transistor TRX.

One end of the variable capacitance circuit CX1, the capacitance of which is variable, is connected to one end (NX1) of the resonator XTAL. Specifically, the one end of the variable capacitance circuit CX1 is connected to the one end of the resonator XTAL via the first terminal (the resonator pad) for the resonator of the circuit device 10. One end of the capacitor CX2 is connected to the other end (NX2) of the resonator XTAL. Specifically, the one end of the capacitor CX2 is connected to the other end of the resonator XTAL via the second terminal (the resonator pad) for the resonator of the circuit device 10. One end of the capacitor CX3 is connected to the one end of the resonator XTAL, and the other end of the capacitor CX3 is connected to the collector of the bipolar transistor TRX.

The base-emitter current generated by the oscillation of the resonator XTAL flows through the bipolar transistor TRX. Further, when the base-emitter current increases, the collector-emitter current of the bipolar transistor TRX increases, and the bias current branched from the current source IBX to the resistor RX decreases, and therefore, the collector voltage VCX is lowered. In contrast, when the base-emitter current of the bipolar transistor TRX decreases, the collector-emitter current decreases, and the bias current branched from the current source IBX to the resistor RX increases, and therefore, the collector voltage VCX is raised. The collector voltage VCX is fed back to the one end of the resonator XTAL via the capacitor CX3. Therefore, the AC component is cut by the capacitor CX3, and the DC component is fed back. The buffer circuit BAX for the oscillation constituted by the bipolar transistor TRX and so on as described above acts as an inverting circuit (an inverting amplifier circuit) for outputting an inversion signal (a signal with a phase difference of 180 degrees) of the signal of the node NX2.

The capacitance value of the variable capacitance circuit CX1 formed of the variable capacitance diode (varactor) or the like is controlled based on the control voltage VC (the control signal). Thus, the adjustment of the oscillation frequency of the oscillation circuit 100 becomes possible. For example, in the case in which the oscillation frequency of the resonator XTAL has temperature dependency, the temperature compensation and so on of the oscillation frequency also becomes possible.

It should be noted that the configuration of the oscillation circuit 100 (101, 102) is not limited to the configuration shown in FIG. 9 and FIG. 10, but a variety of practical modifications can be adopted. For example, as the configuration of the buffer circuit, and the connection configuration of the variable capacitance circuit and the capacitors, there can be adopted a variety of configurations. For example, it is possible to arrange that the capacitance value of each of the variable capacitance circuits (CB1, CB2, and CX1) can be adjusted with a digital value. In this case, the variable capacitance circuit is constituted by a plurality of capacitors (a capacitor array), and a plurality of switch elements (a switch array) each controlled to be set to the ON state or the OFF state based on the frequency control data (control signal in a broad sense) as the digital value. Each of the switch elements is electrically connected to corresponding one of the capacitors. Further, by setting each of the switch elements to the ON state or the OFF state, the number of capacitors, one ends of which are connected to the one end of the resonator XTAL out of the plurality of capacitors, varies. Thus, the capacitance value of the variable capacitance circuit is controlled, and thus, the capacitance value of the one end of the resonator XTAL changes. Therefore, the capacitance value of the variable capacitance circuit is directly controlled by the frequency control data, and it becomes possible to control the oscillation frequency of the oscillation signal.

5. Configuration of Time-to-Digital Conversion Circuit

Figure 11:
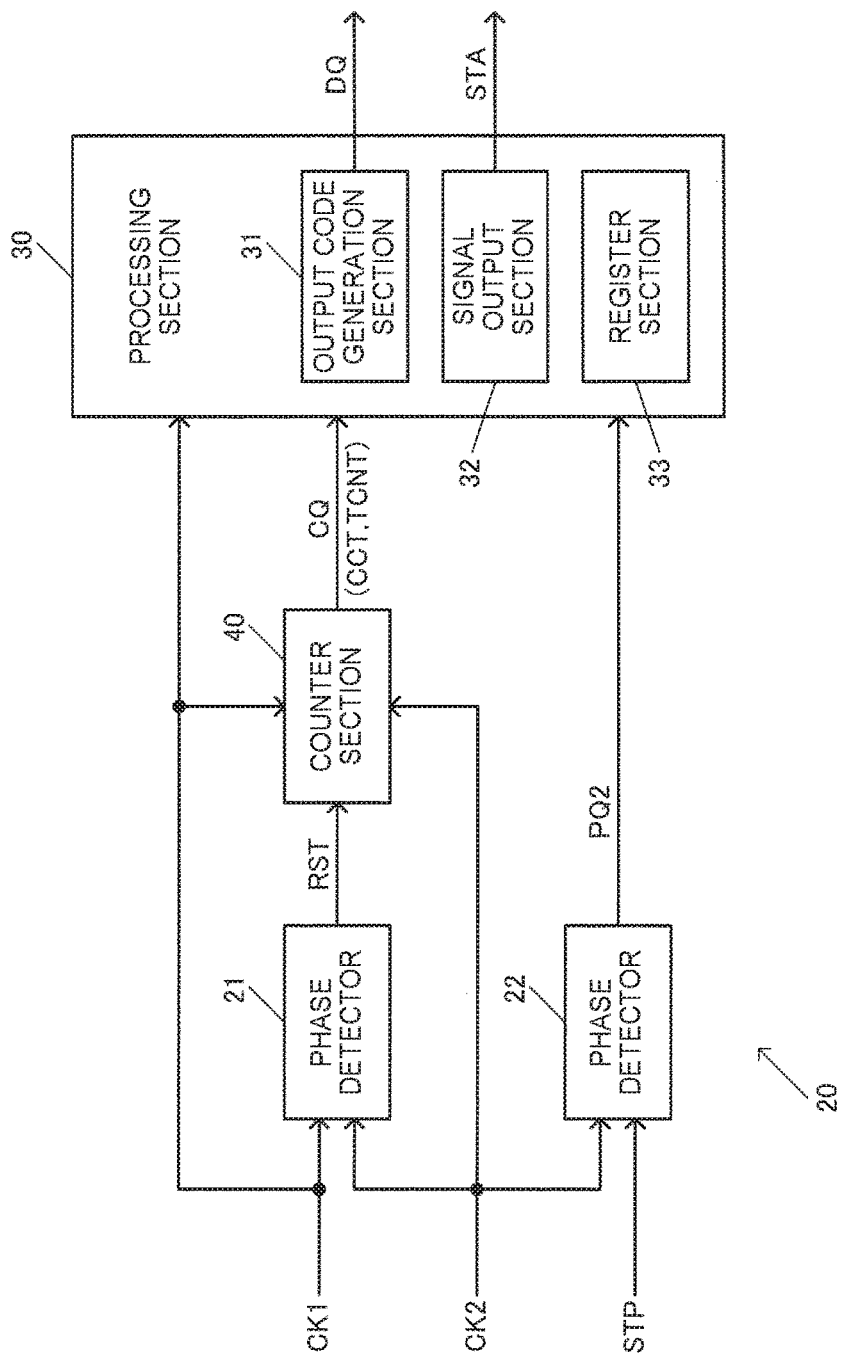
FIG. 11 is a diagram showing a configuration example of a time-to-digital conversion circuit.

FIG. 11 shows a configuration example of the time-to-digital conversion circuit 20. The time-to-digital conversion circuit 20 includes phase detectors 21, 22, a processing section 30, and a counter section 40. It should be noted that the configuration of the time-to-digital conversion circuit 20 is not limited to the configuration shown in FIG. 11, but it is possible to adopt a variety of practical modifications such as elimination of some of the constituents or addition of other constituents.

The clock signals CK1, CK2 are input to the phase detector 21 (phase comparator), and the phase detector 21 outputs a reset signal RST to the counter section 40. For example, the phase detector 21 outputs the reset signal RST, which is a pulse signal activated at the phase synchronization timing.

The signal STP and the clock signal CK2 are input to the phase detector 22 (phase comparator), and the phase detector 22 outputs the signal PQ2 as the phase comparison result. The phase detector 22 samples, for example, one of the signal STP and the clock signal CK2 with the other thereof to thereby perform the phase comparison between the signal STP and the clock signal CK2. The signal PQ2 as the phase comparison result is output to the processing section 30.

The counter section 40 performs a counting process of a count value. For example, the counter section 40 includes at least one of a first counter for performing the counting process based on the clock signal CK1, and a second counter for performing the counting process based on the clock signal CK2. The count value of each of the first and second counters is reset based on the reset signal RST from, for example, the phase detector 22. Further, the count value CQ in the counter section 40 is output to the processing section 30. The count value CQ is the count value of at least one of the first and second counters for performing the counting operation base on the clock signals CK1, CK2, respectively, and corresponds to CCT, TCNT, and so on described later.

The processing section 30 performs the process of converting the time into the digital value DQ. In other words, the processing section 30 performs a variety of types of arithmetic processing related to the time-to-digital conversion. For example, the processing section 30 performs the arithmetic processing for obtaining the digital value DQ corresponding to the time difference between the signal STA and the signal STP. Specifically, the processing section 30 performs the arithmetic processing of the time-to-digital conversion based on the count value CQ from the counter section 40 and the signal PQ2 as the phase comparison result from the phase detector 22. The processing section 30 can be realized by a logic circuit such as an ASIC, a processor such as a CPU, and so on.

The processing section 30 includes an output code generation section 31, a signal output section 32, and a register section 33. The output code generation section 31 performs the arithmetic processing of the time-to-digital conversion to output the conclusive digital value DQ as a conclusive output code. The signal output section 32 generates and then outputs the signal STA. The signal output section 32 outputs the signal STA based on the clock signal CK1. For example, the signal output section 32 outputs the signal STA based on, for example, the clock signal CK1 every clock cycle of the clock signal CK1 as described later. Alternatively, the signal output section 32 outputs the signal STA with the clock cycle designated by, for example, the clock cycle designation value. The register section 33 can be formed of one register or a plurality of registers. For example, the register section 33 includes a register for storing clock cycle designation information described later, and so on. The register section 33 can be realized by, for example, flip-flop circuits or memory elements.

Figure 12:
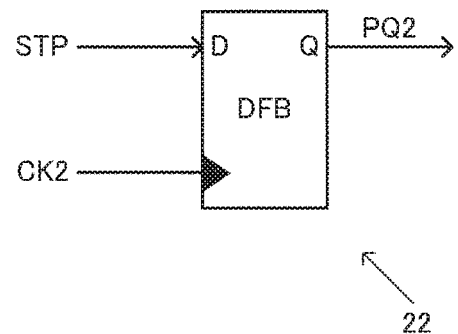
FIG. 12 is a diagram showing a configuration example of a phase detector.

FIG. 12 shows a configuration example of the phase detector 22. The phase detector 22 is formed of, for example, a flip-flop circuit DFB. The signal STP is input to the data terminal of the flip-flop circuit DFB, and the clock signal CK2 is input to the clock terminal thereof. Thus, the phase comparison by sampling the signal STP with the clock signal CK2 can be realized. It should be noted that it is also possible to arrange that the clock signal CK2 is input to the data terminal of the flip-flop circuit DFB, and the signal STP is input to the clock terminal thereof. Thus, the phase comparison by sampling the clock signal CK2 with the signal STP can be realized.

6. Repeating Method of Signal STA

Then, a variety of examples of the time-to-digital conversion method of the present embodiment will be described. Firstly, a method of repeatedly generating the signal STA in every clock cycle will be described.

Figure 13:
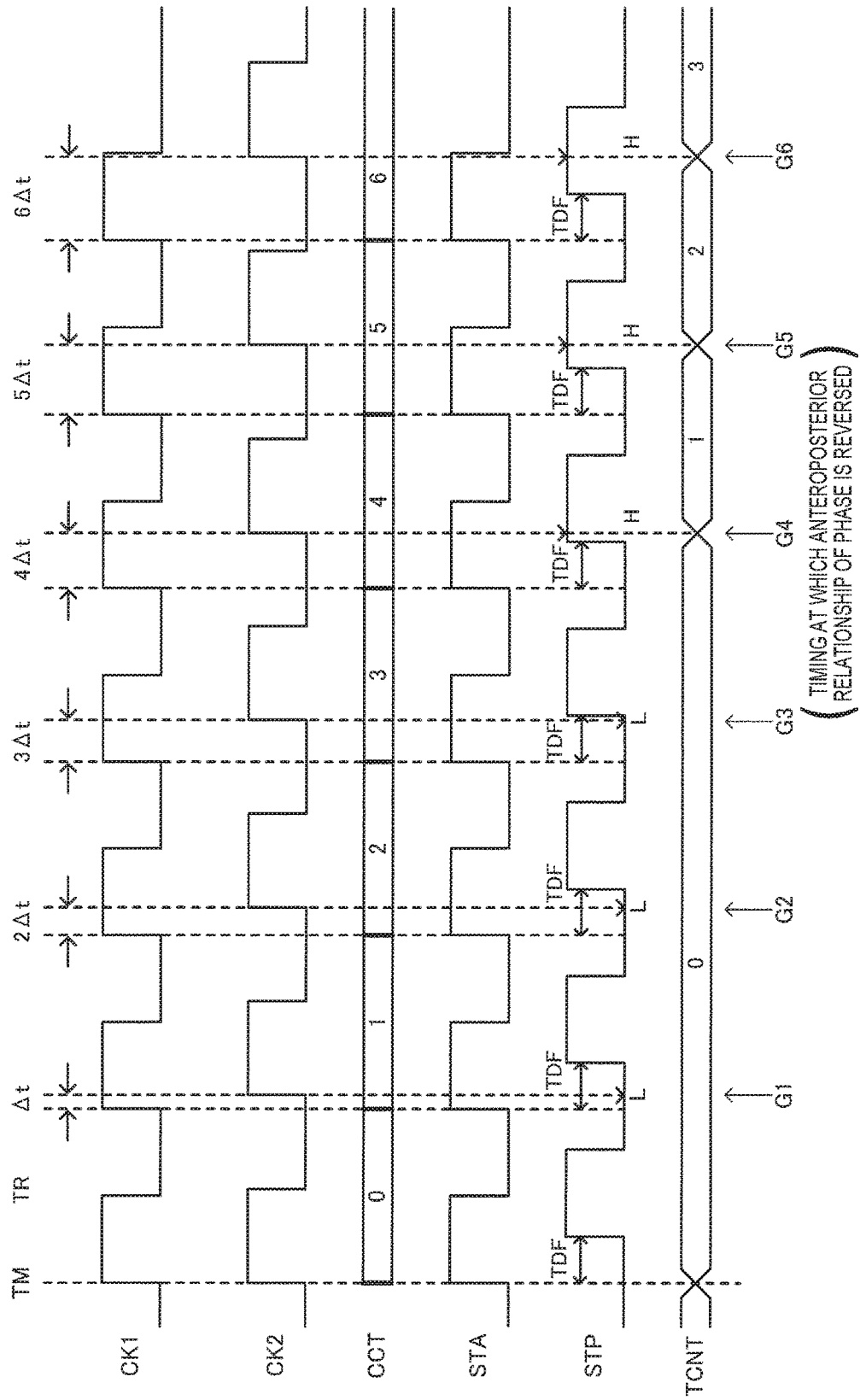
FIG. 13 is a signal waveform chart for explaining a repeating method of the signal STA.

FIG. 13 is a signal waveform chart for explaining the repeating method of the signal SAT (hereinafter arbitrarily described simply as a repeating method) of the present embodiment. In FIG. 13, the phase synchronization between the clock signals CK1, CK2 is achieved at the phase synchronization timing TM. Specifically, at the phase synchronization timing TM, there is performed the phase synchronization for making the transition timings (e.g., rising transition timings, rising edges) of the clock signals CK1, CK2 coincide with each other. The phase synchronization is achieved by the PLL circuit 120. At the phase synchronization timing TM, the count value TCNT of the counter section 40 (the second counter) is reset to, for example, 0.

It should be noted that in the case in which the phase synchronization timing TM becomes the known timing in the system of the circuit device 10, the phase synchronization timing TM is set by, for example, a timing control section (not shown). In this case, it results that the function of the phase detector 21 shown in FIG. 11 is realized by the timing control section. Specifically, the timing control section outputs the reset signal RST activated at the phase synchronization timing TM to the counter section 40.

Then, after the phase synchronization timing TM between the clock signals CK1, CK2, the time-to-digital conversion circuit 20 makes the transition of the signal level of the signal STA based on the clock signal CK1. Specifically, after the phase synchronization timing TM, the time-to-digital conversion circuit 20 makes the transition of the signal level of the signal STA at every clock cycle of the clock signal CK1. For example, by the signal output section 32 shown in FIG. 11 outputting the signal, which is obtained by buffering the clock signal CK1 with a buffering circuit, as the signal STA, the signal level of the signal STA becomes to make the transition at every clock cycle.

In FIG. 13, CCT denotes a clock cycle value. The clock cycle value CCT is updated at every clock cycle of the clock signal CK1. Specifically, the clock cycle value CCT is incremented at every clock cycle. It should be noted that the clock cycle value of the first clock cycle is set to CCT=0 here for the sake of convenience of explanation. Therefore, the clock cycle value of the subsequent clock cycle becomes CCT=1. Further, although in FIG. 13, CCT denotes the clock cycle value of the clock signal CK1, it is also possible to use the clock cycle value of the clock signal CK2.

As described above, when the signal STA makes the transition of the signal level based on the clock signal CK1 after the phase synchronization timing TM, the signal STP makes the transition of the signal level in accordance with the signal STA as explained with reference to FIG. 3 and FIG. 4. Here, the time difference in transition timing between the signals STA, STP is defined as TDF.

In this case, the time-to-digital conversion circuit 20 performs the phase comparison between the signal STP and the clock signal CK2 as indicated by the arrows G1 through G6 shown in FIG. 13. Then, based on the result of the phase comparison, the time-to-digital conversion circuit 20 obtains the digital value DQ corresponding to the time difference TDF in transition timing between the signals STA, STP. Specifically, the processing section 30 shown in FIG. 11 performs the arithmetic processing for obtaining the digital value DQ based on the signal PQ2 as the phase comparison result from the phase detector 22.

For example, as explained with reference to FIG. 2, after the phase synchronization timing TM, the inter-clock time difference TR as the time difference in transition timing between the clock signals CK1, CK2 continues to increase at every clock cycle of the clock signal CK1 in such a manner as $\Delta t, 2\Delta t, 3\Delta t, \ldots 6\Delta t$. In the repeating method of the present embodiment, the time-to-digital conversion is realized focusing attention on the inter-clock time difference TR increasing by $\Delta t$ in such a manner after the phase synchronization timing TM.

Specifically, the time-to-digital conversion circuit 20 performs the phase comparison between the signal STP and the clock signal CK2 at every clock cycle as indicated by the arrows G1 through G6 shown in FIG. 13. The phase comparison can be realized by sampling, for example, one of the signal STP and the clock signal CK2 with the other thereof.

Further, at the arrows G1 through G3, the signal PQ2 as the phase comparison result, which is the signal obtained by sampling the signal STP with the clock signal CK2, is in the L level. In other words, at the arrows G1 through G3, since the signal STP lags in phase behind the clock signal CK2, the signal PQ2 is set to the L level.

As described above, at the arrows G1 through G3 shown in FIG. 13, based on the result of the phase comparison between the signal STP and the clock CK2, it is determined that the signal STP lags in phase behind the clock signal CK2. In other words, at the arrows G1, G2, and G3, TDF>TR=$\Delta t$, TDF>TR=$2\Delta t$, and TDF>TR=$3\Delta t$ are true, respectively, and the time difference TDF in transition timing between the signals STA, STP is longer than the inter-clock time difference TR between the clock signals CK1, CK2.

Further, at the arrow G4 shown in FIG. 13, the anteroposterior relationship in phase between the signal STP and the clock signal CK2 is reversed. For example, the state in which the signal STP lags in phase behind the clock signal CK2 is switched to the state in which the signal STP leads in phase over the clock signal CK2.

When the anteroposterior relationship of the phase is reversed in such a manner, the signal PQ2 as the phase comparison result, which is the signal obtained by sampling the signal STP with the clock signal CK2, turns to the H level as indicated by the arrows G4 through G6. In other words, at the arrows G4 through G6, since the signal STP leads in phase over the clock signal CK2, the signal PQ2 is set to the H level.

As described above, at the arrows G4 through G6, based on the result of the phase comparison between the signal STP and the clock CK2, it is determined that the signal STP leads in phase over the clock signal CK2. In other words, at the arrows G4, G5, and G6, TDF<TR=$4\Delta t$, TDF<TR=$5\Delta t$, and TDF<TR=$6\Delta t$ are true, respectively, and the time difference TDF in transition timing between the signals STA, STP is shorter than the inter-clock time difference TR between the clock signals CK1, CK2.

Further, at the arrows G1 through G3 shown in FIG. 13, the signal PQ2 as the phase comparison result is in the L level, and it is determined that the signal STP lags in phase behind the clock signal CK2. In this case, the count value TCNT is not updated. For example, the count value TCNT does not increase from 0. In contrast, at the arrows G4 through G6, the signal PQ2 as the phase comparison result is in the H level, and it is determined that the signal STP leads in phase over the clock signal CK2. In this case, the count value TCNT is updated. For example, the count value TCNT is increment by 1, for example, at every clock cycle.

The time-to-digital conversion circuit 20 (the processing section 30) obtains the digital value DQ corresponding to the time difference TDF using the count value TCNT obtained in such a manner. For example, by performing the conversion process of a code represented by the count value TCNT, the output code as the conclusive digital value DQ is obtained and then output.

Figure 14:
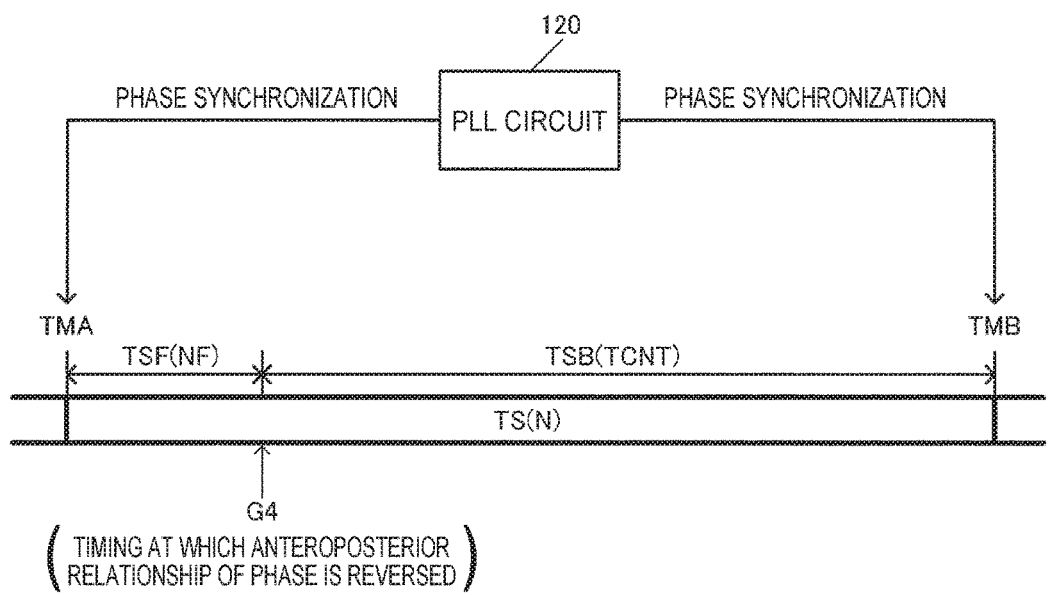
FIG. 14 is a signal waveform chart for explaining the repeating method of the signal STA.

FIG. 14 is an explanatory diagram of the repeating method of the present embodiment. At the phase synchronization timings TMA, TMB, the phase synchronization between the clock signals CK1, CK2 is performed by the PLL circuit 120. Thus, the transition timings of the clock signals CK1, CK2 become to coincide with each other at the phase synchronization timings TMA, TMB. Further, the period between the phase synchronization timings TMA, TMB is defined as the measurement period TS. In the repeating method of the present embodiment, the digital value DQ corresponding to the time difference TDF is obtained in the measurement period TS.

Specifically, as indicated by the arrow G4 shown in FIG. 13 and FIG. 14, the time-to-digital conversion circuit 20 identifies the timing (the clock cycle), at which the anteroposterior relationship in phase between the signal STP and the clock signal CK2 is reversed, to thereby obtain the digital value DQ corresponding to the time difference TDF. For example, by identifying the clock cycle which is indicated by the arrow G4, and in which CCT=4 is obtained, it can be determined that the digital value DQ corresponding to the time difference TDF is the digital value (alternatively, the digital value corresponding to a value between 3Δt and 4Δt) corresponding to, for example, TR=4Δt. Therefore, since it becomes possible to convert the time difference TDF into the digital value DQ in a single measurement period TS shown in FIG. 14, the speeding-up of the time-to-digital conversion can be achieved.

For example, in the related art method of Document 4 described above, since just one start pulse is generated during one measurement period for performing the time measurement, it is necessary to repeat the measurement period an extremely large number of times in order to obtain the conclusive digital value.

In contrast, according to the repeating method of the present embodiment, the digital value DQ is obtained by generating the signal STA a plurality of times to perform the phase comparison a plurality of times in one measurement period TS as shown in FIG. 13 and FIG. 14. Thus, since it becomes possible to obtain the conclusive digital value DQ within the single measurement period TS, it is possible to dramatically speed-up the time-to-digital conversion compared to the related art method.

It should be noted that in FIG. 14, the length of the measurement period TS corresponds to, for example, the number of clock pulses N (the number of clock cycles) of the clock signal CK1 in the measurement period TS. For example, the PLL circuit 120 performs the phase synchronization between the clock signals CK1, CK2 in every measurement period TS corresponding to the preset number of clock pulses N as a result. Further, in the repeating method of the present embodiment, in order to realize the high-resolution time-to-digital conversion, the number of clock pulses N in the measurement period TS is set to an extremely large number such as 1000 or more (or 5000 or more). For example, in the case of defining the clock frequencies of the clock signals CK1, CK2 as f1, f2, the resolution of the time-to-digital conversion of the present embodiment can be expressed as follows.

$$\Delta t = |f1-f2|/(f1 \times f2)$$

Therefore, the smaller the frequency difference |f1−f2| is, or the larger the value of f1×f2 is, the finer the resolution Δt becomes, and thus, the time-to-digital conversion high in resolution can be realized. Further, as the resolution Δt becomes finer, the number of clock pulses N in the measurement period TS also increases.

Further, the count value TCNT corresponds to the length of the period TSB shown in FIG. 14. Here, the anterior period from the phase synchronization timing TMA to the timing indicated by the arrow G4 at which anteroposterior relationship in phase is reversed is defined as TSF, and the posterior period from the timing of G4 to the phase synchronization timing TMB is defined as TSB. For example, in the case of defining the number of clock pulses (the number of clock cycles) of the clock signal CK1 in the period TSF as NF, N=NF+TCNT, for example, is true. For example, in FIG. 13, NF=4 is obtained, the value corresponding to the conclusive digital value DQ=4×Δt becomes the digital value corresponding to the number of clock pulses NF. Therefore, the time-to-digital conversion circuit 20 (the processing section 30) obtains the digital value corresponding to NF=N-TCNT based on the count value TCNT, as a result. For example, in the case in which the digital value DQ is an 8-bit value, the digital value corresponding to the number of clock pulses N becomes, for example, 11111111. It should be noted that it is also possible to perform the count process of the number of clock pulses NF to thereby obtain the digital value DQ.

It should be noted that in the case of increasing the number of clock pulses N corresponding to the measurement period TS, the measurable time difference TDF in FIG. 13 decreases, and therefore, the dynamic range reduces. However, in the repeating method of the present embodiment, the time-to-digital conversion is completed in one measurement period TS while increasing the number of clock pulses N to improve the resolution. Thus, it becomes possible to realize an improvement in resolution while achieving the speeding-up of the conversion process as in the case of, for example, the flash A/D conversion.

In this case, in the repeating method of the present embodiment, it is also possible to arrange that the signal STA is generated only in a specific period to perform the phase comparison instead of always generating the signal STA at every clock cycle to perform the phase comparison. For example, it is also possible to arrange that the search range of the digital value DQ is narrowed by the method of binary search described later, and then the signal STA is generated to perform the phase comparison at every clock cycle in the period corresponding to the search range to thereby obtain the conclusive digital value DQ. In this case, it is sufficient to perform the time-to-digital conversion in which the signal STA is generated at every clock cycle to perform the phase comparison only in the period corresponding to the narrowed search range in, for example, the measurement period TS shown in FIG. 14. Further, after the timing (G4) at which the anteroposterior relationship in phase is reversed is identified, it is possible to stop generating the signal STA to thereby achieve reduction of power consumption.

Further, in the present embodiment, as shown in FIG. 1, the clock signals CK1, CK2 are made to be clock signals generated using the resonators XTAL1, XTAL2, respectively. As described above, according to the method of using the clock signals CK1, CK2 generated using the resonators XTAL1, XTAL2, the accuracy of the measurement of the time (the physical quantity) can dramatically be improved compared to the related art method of realizing the time-to-digital conversion using a semiconductor element as in the vernier delay circuit.

For example, in the related art method using the semiconductor element, there is a problem that it is difficult to improve the accuracy although it is relatively easy to improve the resolution. Specifically, the delay time of the delay element as the semiconductor significantly varies due to the manufacturing variation and the environmental variation. Therefore, due to the variation, there is a limitation in improvement of the measurement accuracy. For example, it is possible to guarantee the relative accuracy to some extent, but it is difficult to guarantee the absolute accuracy.

In contrast, the oscillation frequency of the resonator is extremely small in variation due to the manufacturing variation and the environmental variation compared to the delay time of the delay element as the semiconductor element. Therefore, according to the method of performing the time-to-digital conversion using the clock signals CK1, CK2 generated using the resonators XTAL1, XTAL2, the accuracy can dramatically be improved compared to the related art method of using the semiconductor element. Further, by decreasing the frequency difference between the clock signals CK1, CK2, it is also possible to improve the resolution.

For example, by setting the frequency difference $\Delta f$ between the clock signals CK1, CK2 to $\Delta f=|f1-f2|=1$ MHz, and f1, f2 to 100 MHz, it is possible to set the resolution $\Delta t=|f1-f2|/(f1\times f2)$ to about 100 ps (picosecond). Similarly, by setting f1, f2 to about 100 MHz, and the frequency difference $\Delta f$ to $\Delta f=100$ kHz, 10 kHz, and 1 kHz, it is possible to set the resolution $\Delta t$ to about 10 ps, 1 ps, and 0.1 ps, respectively. Further, the variation in oscillation frequency of each of the resonators XTAL1, XTAL2 is extremely small compared to the method of using the semiconductor element. Therefore, it is possible to realize both of the improvement of the resolution and the improvement of the accuracy.

Further, in the related art method of Document 4 described above, the time-to-digital conversion is realized using the quartz crystal resonator. However, in this related art method, there is adopted a configuration of sequentially delaying the start timing of the time measurement from the timing of the synchronization point at which the edges of the first and second clock pulses match each other. Further, each time measurement is performed from the timing of the synchronization point, at which the edges of the first and second clock pulses match each other, and the time measurement is required to be repeated a number of times. Therefore, there is a problem that the conversion time of the time-to-digital conversion becomes extremely long.

In contrast, in the repeating method of the present embodiment, the signal STA is generated a plurality of times in the measurement period TS to perform the phase comparison a plurality of times to thereby realize the time-to-digital conversion. Therefore, the time-to-digital conversion can dramatically be speeded up compared to the related art method.

7. Updating Method of Clock Cycle Designation Value

Then, as the time-to-digital conversion method according to the present embodiment, a method of realizing the time-to-digital conversion by the update of the clock cycle designation value (clock cycle designation information in a broad sense) will be described.

Figure 15:
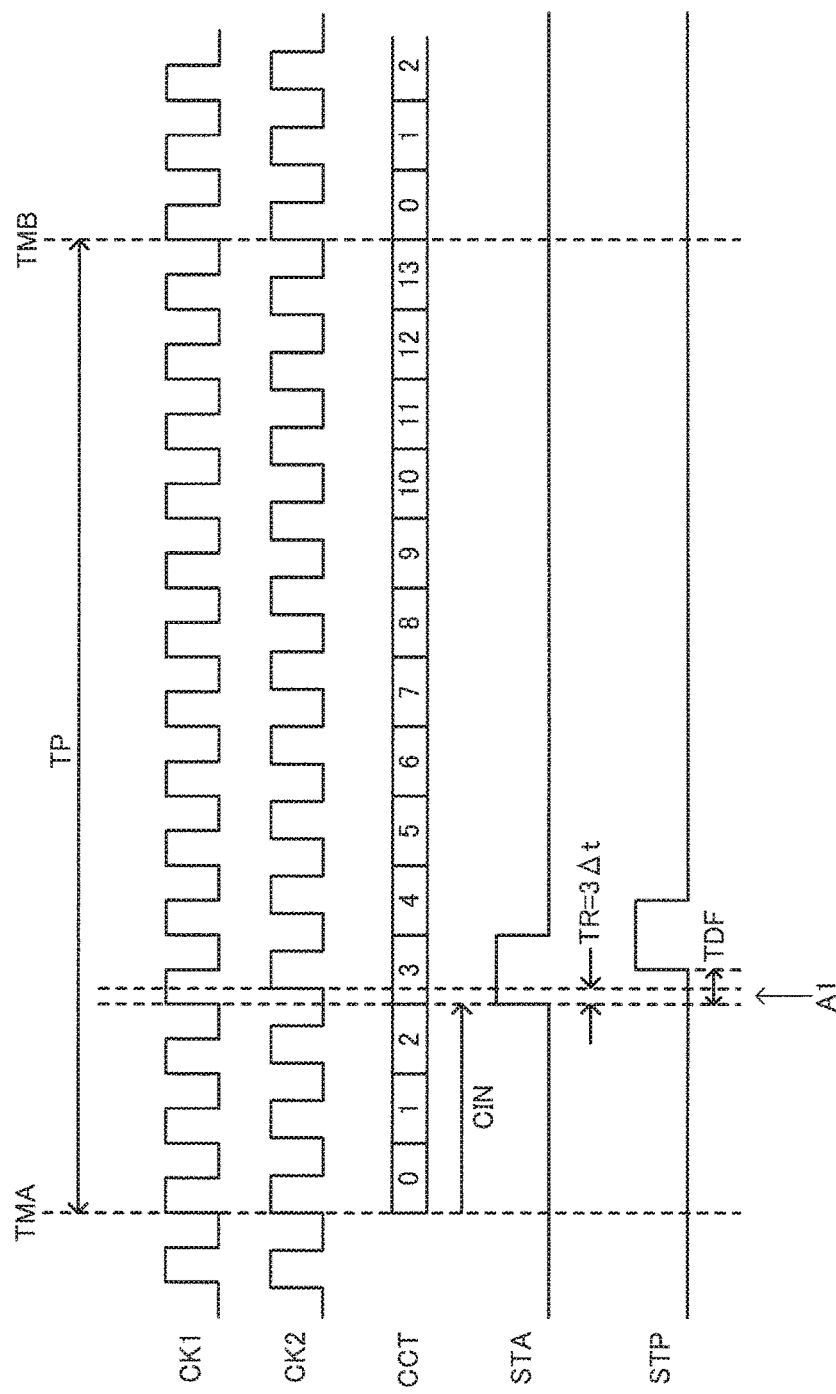
FIG. 15 is a signal waveform chart for explaining an updating method of a clock cycle designation value.
Figure 16:
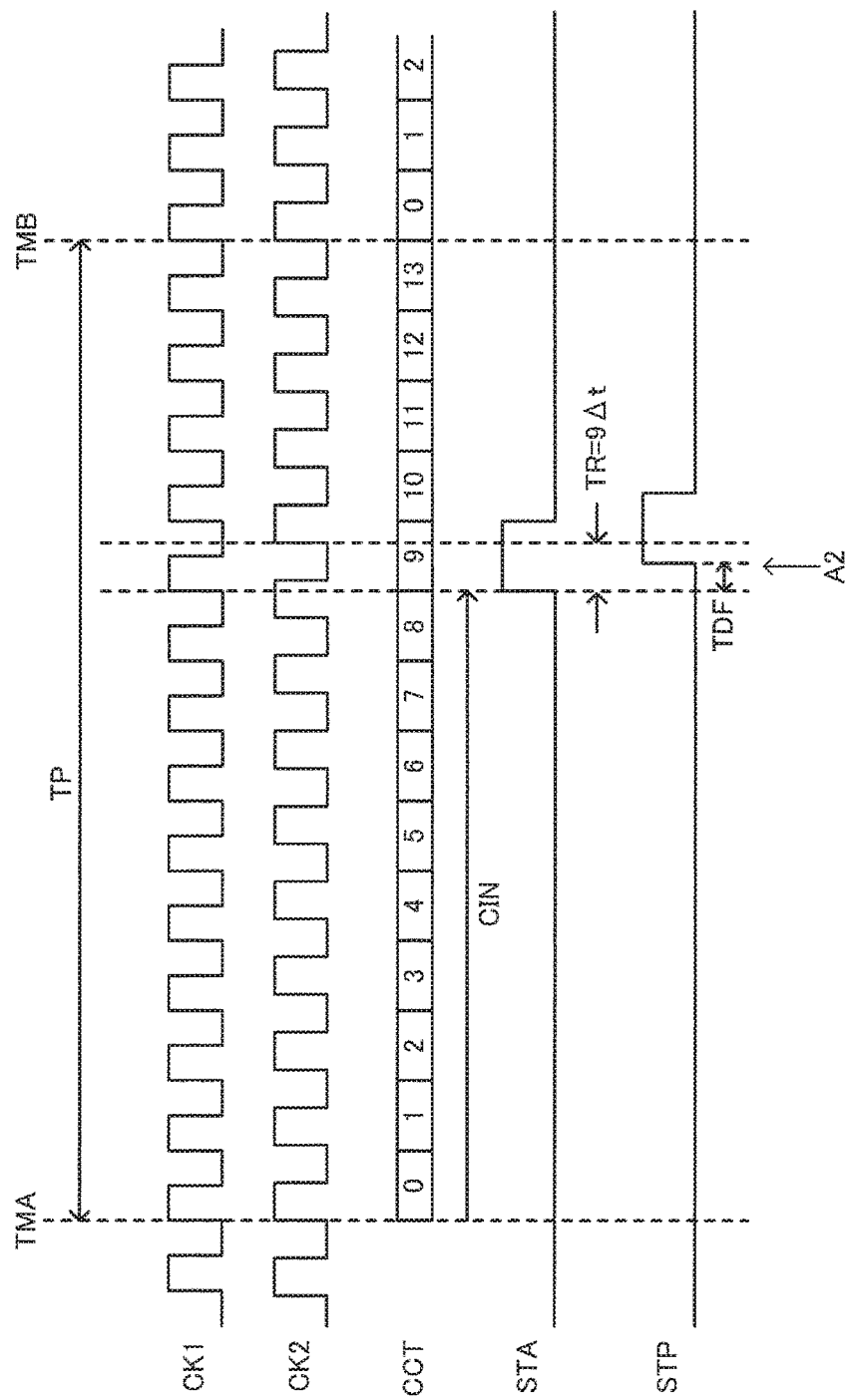
FIG. 16 is a signal waveform chart for explaining an updating method of the clock cycle designation value.
Figure 17:
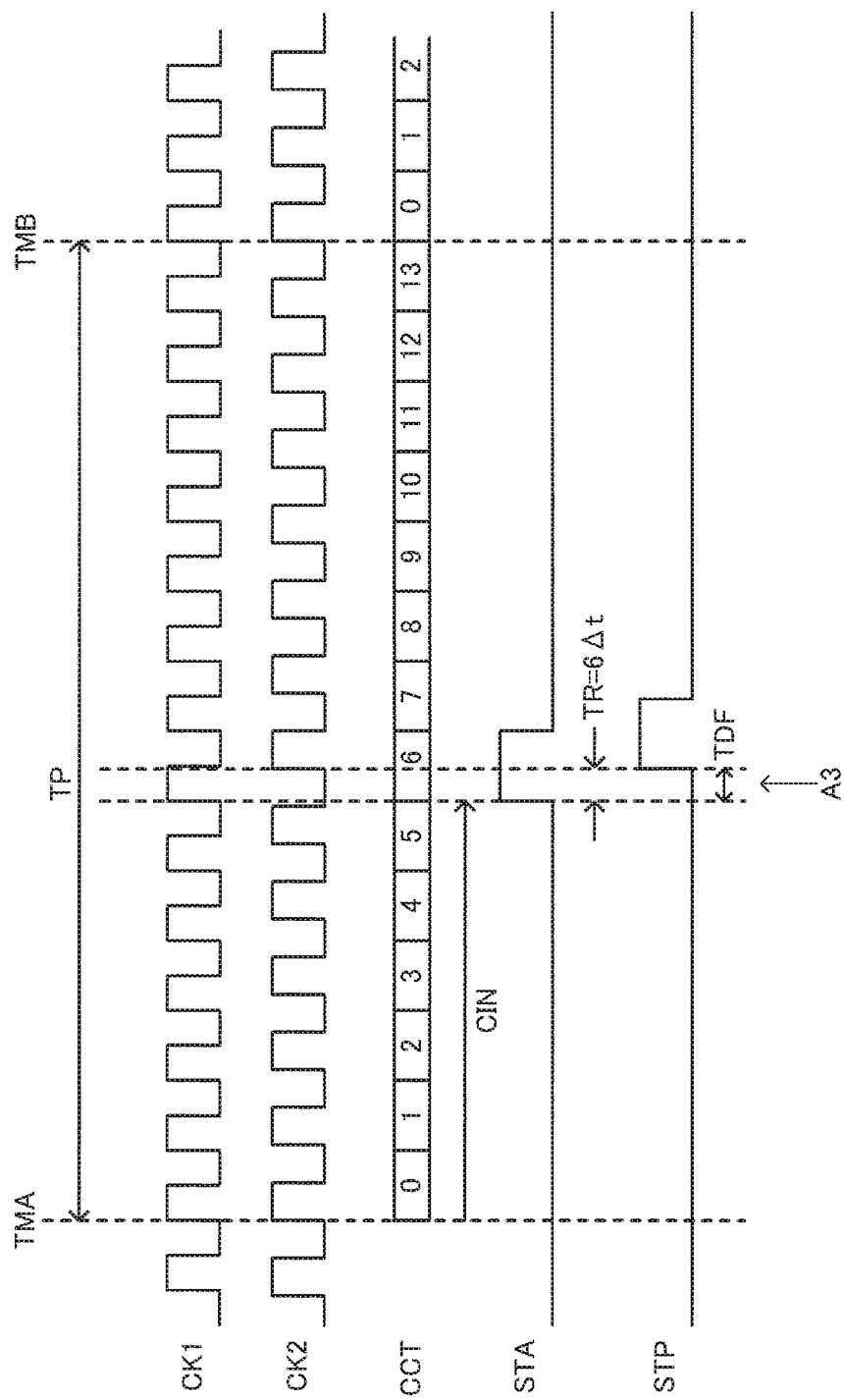
FIG. 17 is a signal waveform chart for explaining an updating method of the clock cycle designation value.

FIG. 15 through FIG. 17 are signal waveform charts for explaining the updating method of the clock cycle designation value (hereinafter arbitrarily described simply as an updating method). The reference symbol CIN denotes the clock cycle designation information. The description will hereinafter be presented assuming that CIN is the clock cycle designation value represented by the clock cycle designation information.

The reference symbols TMA, TMB are each the phase synchronization timing. In FIG. 15 through FIG. 17, the phase synchronization timings TMA, TMB are each the timing at which the transition timings (the rising edges) of the clock signals CK1, CK2 coincide with each other. It should be noted that the updating method of the present embodiment is not limited to the above, but the phase synchronization timings TMA, TMB are each the timing at which the anteroposterior relationship in phase between the clock signals CK1, CK2 is reversed. The timing at which the anteroposterior relationship in the phase is reversed is the timing at which the state in which one of the clock signals leads in phase over the other is switched to the state in which the one of the clock signals lags in phase behind the other.

The updating period TP is a period between the phase synchronization timings TMA, TMB. In the updating method of the present embodiment, the update of the clock cycle designation value is performed, for example, once in the updating period TP. It should be noted that in FIG. 15 through FIG. 17, there is shown the case in which the number of clock pulses of the clock signal CK1 in the updating period TP is 14 for the sake of simplification of the explanation. However, in reality, in order to set the high resolution, the number of clock pulses in the updating period TP is set to an extremely large number such as 1000 or more (or 5000 or more).

In the updating period TP (a first updating period) shown in FIG. 15, the clock cycle designation value is set to CIN=3. Therefore, the transition of the signal level of the signal STA is made in the clock cycle (CCT=3) designated by CIN=3. As described above, in the updating method of the present embodiment, the transition of the signal level of the signal STA is made in the clock cycle of the clock signal CK1 designated based on the clock cycle designation value CIN (the clock cycle designation information). Further, as described with reference to FIG. 3 and FIG. 4, the transition of the signal level of the signal STP is made in accordance with the signal STA, and the time difference in transition timing between the signals STA, STP is obtained as TDF.

In contrast, in the clock cycle (CCT=3) designated by CIN=3, the inter-clock time difference as the time difference in transition timing between the clock signals CK1, CK2 is set to TR=CIN×$\Delta t$=3$\Delta t$ as described with reference to FIG. 2.

In this case, in the updating method according to the present embodiment, the phase comparison between the signal STP and the clock signal CK2 is performed as indicated by the arrow A1 shown in FIG. 15. The phase comparison can be realized by sampling, for example, one of the signal STP and the clock signal CK2 with the other thereof.

Further, at the arrow A1 shown in FIG. 15, the phase comparison result, which is the result obtained by sampling the signal STP with the clock signal CK2, is in the L level. Due to the result of the phase comparison, it is determined that the signal STP lags in phase behind the clock signal CK2. In other words, at the arrow A1 shown in FIG. 15, TDF>TR=3Δt is true, and the time difference TDF in transition timing between the signals STA, STP is longer than the inter-clock time difference TR=3Δt between the clock signals CK1, CK2. In this case, there is performed the update of increasing the clock cycle designation value CIN.

In the updating period TP (a second updating period) shown in FIG. 16, the clock cycle designation value is set to CIN=9. For example, in the previous updating period TP shown in FIG. 15, by performing the update of increasing the clock cycle designation value from CIN=3 as described above, the clock cycle designation value is updated to CIN=9. Therefore, the transition of the signal level of the signal STA is made in the clock cycle (CCT=9) designated by CIN=9. Further, the transition of the signal level of the signal STP is made in accordance with the signal STA, and the time difference in transition timing between the signals STA, STP is obtained as TDF.

In contrast, in the clock cycle (CCT=9) designated by CIN=9, the inter-clock time difference between the clock signals CK1, CK2 is set to TR=CIN×Δt=9Δt.

Further, in the updating method according to the present embodiment, the phase comparison between the signal STP and the clock signal CK2 is performed as indicated by the arrow A2 shown in FIG. 16. In this case, since the phase comparison result as the result obtained by sampling the signal STP with the clock signal CK2 is in the H level, there is determined that the signal STP leads in phase over the clock signal CK2. In other words, at the arrow A2 shown in FIG. 16, TDF<TR=9Δt is true, and the time difference TDF is set shorter than the inter-clock time difference TR=9Δt. In this case, there is performed the update of decreasing the clock cycle designation value CIN.

In the updating period TP (a third updating period) shown in FIG. 17, the clock cycle designation value is set to CIN=6. For example, in the previous updating period TP shown in FIG. 16, by performing the update of decreasing the clock cycle designation value from CIN=9 as described above, the clock cycle designation value is updated to CIN=6. Therefore, the transition of the signal level of the signal STA is made in the clock cycle (CCT=6) designated by CIN=6. Further, the transition of the signal level of the signal STP is made in accordance with the signal STA, and the time difference in transition timing between the signals STA, STP is obtained as TDF.

In contrast, in the clock cycle (CCT=6) designated by CIN=6, the inter-clock time difference between the clock signals CK1, CK2 is set to TR=CIN×Δt=6Δt.

Further, in the updating method according to the present embodiment, the phase comparison between the signal STP and the clock signal CK2 is performed as indicated by the arrow A3 shown in FIG. 17. In this case, at the arrow A3 shown in FIG. 17, the signal STP and the clock signal CK2 coincide (roughly coincide) in transition timing (the phase) with each other. In other words, at the arrow A3 shown in FIG. 17, TDF=TR=6Δt is true. Therefore, in this case, as the digital value obtained by converting the time difference TDF between the signals SAT, STP, the digital value corresponding to DQ=TR=6Δt is output as the conclusive result.

It should be noted that although in FIG. 15 through FIG. 17, the increment and the decrement of the clock cycle designation value CIN between the updating periods are set to a value larger than 1, in reality, as in the case of the A-sigma type A/D conversion, the increment and the decrement of the clock cycle designation value CIN can be set to a small value GK equal to or smaller than 1. The value GK is a gain coefficient, and is a value fulfilling GK1.

For example, although in FIG. 15 and FIG. 16, the clock cycle designation value CIN is increased from 3 to 9, in reality, there is performed the update of increasing the clock cycle designation value CIN as much as the given value GK, for example, every updating period. For example, in the case of setting the gain coefficient fulfilling GK1 as GK, there is performed the update of adding GK to the clock cycle designation value CIN. For example, in the case of GK=0.1, in the case in which, for example, the update of adding GK continues 10 times, the clock cycle designation value CIN is incremented as much as 1, as a result.

Further, although in FIG. 16 and FIG. 17, the clock cycle designation value CIN is decreased from 9 to 6, in reality, there is performed the update of decreasing the clock cycle designation value CIN as much as the given value GK, for example, every updating period. For example, there is performed the update of subtracting GK from the clock cycle designation value CIN. For example, in the case of GK=0.1, in the case in which, for example, the update of subtracting GK continues 10 times, the clock cycle designation value CIN is decremented as much as 1, as a result.

Further, it is assumed that after the signal STP and the clock signal CK2 roughly coincide in transition timing with each other at the arrow A3 shown in FIG. 17, the clock cycle designation value CIN continues to be updated, and varies in such a manner as 6, 7, 6, 7, . . . . In this case, it is possible to determine the digital value DQ to be output as the conclusive result as a value (e.g., 6.5×Δt) between 6Δt and 7Δt. As described above, according to the updating method of the present embodiment, it is also possible to make the effective resolution finer as in the A-sigma type A/D conversion.

As described hereinabove, in the updating method of the present embodiment, the phase comparison between the signal STP having the signal level, transition of which is made in accordance with the signal STA, and the clock signal CK2 is performed, and the clock cycle designation value CIN for making the transition of the signal level of the signal STA is updated based on the result of the phase comparison.

Specifically, the transition of the signal level of the signal STA is made in the clock cycle designated by the clock cycle designation value CIN. For example, in FIG. 15, the transition of the signal level of the signal STA is made in the clock cycle designated by CIN=3. In FIG. 16, the transition of the signal level of the signal STA is made in the clock cycle designated by CIN=9. The same applies to FIG. 17.

Then, when the transition of the signal level of the signal STP is made in accordance with the signal STA, the phase comparison between the signal STP and the clock signal CK2 is performed, and then, the clock cycle designation value CIN is updated based on the phase comparison result. For example, in FIG. 15, since there is obtained the phase comparison result that the signal STA lags in phase behind the clock signal CK2, the clock cycle designation value CIN is updated from CIN=3 in FIG. 15 to CIN=9 in FIG. 16. In FIG. 16, since there is obtained the phase comparison result that the signal STA leads in phase over the clock signal CK2, the clock cycle designation value CIN is updated from CIN=9 in FIG. 16 to CIN=6 in FIG. 17. The conclusive value of the clock cycle designation value CIN updated in such a manner is output as the digital value DQ of the time difference TDF between the signals STA, STP.

Further, in the updating method of the present embodiment, the clock cycle designation value CIN continues to be updated in the updating periods. Further, there is adopted the configuration in which the clock cycle designation value CIN thus updated is fed back. Therefore, even in the case in which the time or the physical quantity to be the measurement object varies dynamically, it is possible to realize the time-to-digital conversion following the dynamic variation. For example, even in the case in which the clock cycle designation value CIN corresponding to the time (the time difference TDF) as the measurement object is approached as indicated by the arrow A3 shown in FIG. 17, and then the time varies dynamically, it is possible to deal with such a dynamic variation by sequentially updating the clock cycle designation value CIN accordingly.

Further, in the updating method of the present embodiment, in the case of reducing the error component due to the discrepancy in transition timing between the clock signals CK1, CK2, it is desirable for the time-to-digital conversion circuit 20 to perform the process of converting the time difference into the digital value DQ based on the clock cycle designation value and the clock count information of the clock signal CK1 or the clock signal CK2 in the updating period of the clock cycle designation value. For example, by performing the update of the clock cycle designation value CIN based on the phase comparison result between the signal STP and the clock signal CK2, and the clock count information, the digital value DQ is obtained.

Therefore, in the updating method of the present embodiment, even if the transition timings of the clock signals CK1, CK2 fail to exactly coincide with each other at the phase synchronization timing, the time-to-digital conversion can be realized. For example, in the updating method of the present embodiment, it is sufficient for the phase synchronization timings TMA, TMB to be the timing at which the anteroposterior relationship in phase between the clock signals CK1, CK2 is reversed, and it is not required for the transition timings of the clock signals CK1, CK2 to completely coincide with each other. Therefore, in the present embodiment, it is also possible to adopt a practical modification of eliminating the PLL circuit 120.

For example, in order to make the transition timings of the clock signals CK1, CK2 exactly coincide with each other at the phase synchronization timing, it is necessary to fulfill the relationship of N/f1=M/f2. Here, N, M are numbers of clock pulses of the clock signals CK1, CK2 in the updating period, respectively, and are each an integer equal to or greater than 2. However, in some cases, it is actually difficult to set the clock frequencies f1, f2 due to the resonators XTAL1, XTAL2 shown in FIG. 1 to the frequencies exactly fulfilling the relationship of N/f1=M/f2. Further, in the case in which the relationship of N/f1=M/f2 is not fulfilled, if the PLL circuit 120 is not provided, a shift is caused between the transition timings of the clock signals CK1, CK2 at the phase synchronization timings TMA, TMB, and there is a possibility that the shift turns to the conversion error.

Therefore, in the updating method of the present embodiment, the number of clock pulses N in each of the updating periods is measured. Due to the shift existing between the transition timings of the clock signals CK1, CK2 at the phase synchronization timings TMA, TMB, the number of clock pulses N fails to be a constant value at all times, but varies between the updating periods. The time-to-digital conversion circuit 20 performs the update of the clock cycle designation value CIN based on the number of clocks N varying in such a manner, and the phase comparison result between the signal STA and the clock signal CK2. By adopting this configuration, the conversion error caused by the shift between the transition timings of the clock signals CK1, CK2 at the phase synchronization timings TMA, TMB can be reduced.

8. Binary Search Method

Then, a binary search method will be described as the time-to-digital conversion method according to the present embodiment.

Figure 18:
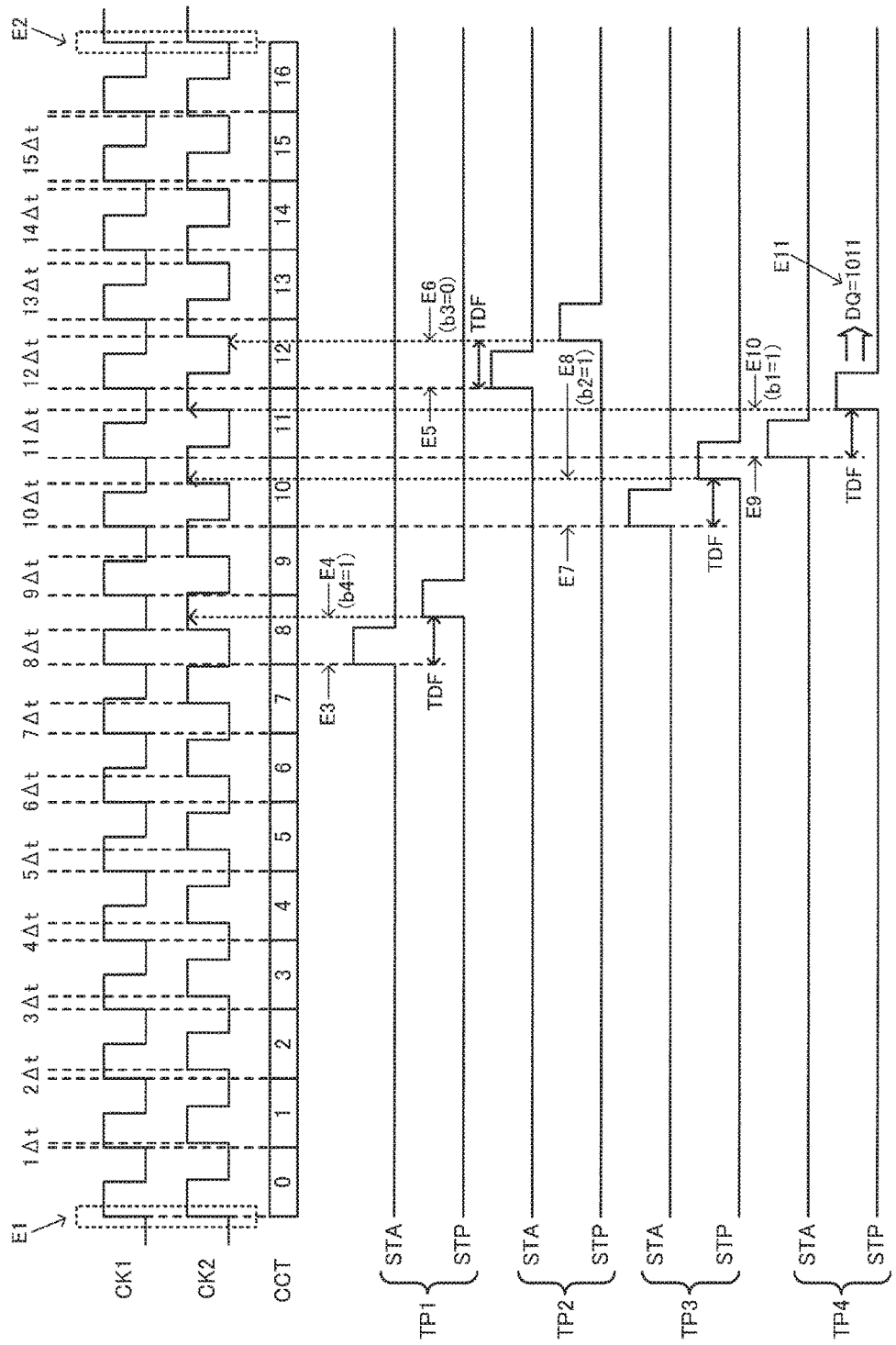
FIG. 18 is a signal waveform chart for explaining a binary search method.

FIG. 18 is a signal waveform chart for explaining the binary searching method. In FIG. 18, the digital value corresponding to the time difference in transition timing between the signal STA and the signal STP is obtained using the binary search method with the resolution corresponding to the frequency difference between the clock frequencies f1, f2. Specifically, the update of the clock cycle designation value CIN based on the phase comparison result between the signal STP and the clock signal CK2 is achieved by the binary search.

The binary search (dichotomizing search, a dual-partitioning method) is a method of sequentially obtaining the conclusive digital value while narrowing the search range by dividing (dividing into two parts) the search range one after another. For example, it is assumed that the digital value DQ obtained by converting the time difference is 4-bit data, and the bits of the 4-bit data are b4, b3, b2, and b1, respectively. The bit b4 is the MSB, and the bit b1 is the LSB. In FIG. 18, the bits b4, b3, b2, and b1 of the digital value DQ are obtained by the binary search. For example, due to a similar method to the successive approximation A/D conversion, the bits b4, b3, b2, and b1 of the digital value DQ are obtained in series.

For example, in FIG. 18, the clock frequencies of the clock signals CK1, CK2 are set to, for example, f1=100 MHz (the period is 10 ns), and f2=94.12 MHz (the period is 10.625 ns), and the resolution $\Delta t$ is set to $\Delta t$=0.625 ns. Further, E1, E2 in FIG. 18 denote the phase synchronization timings at which the clock signals CK1, CK2 coincide, for example, in transition timing with each other. Further, the clock cycle designation value CIN is set to, for example, CIN=8 as an initial value. The initial value of CIN=8 corresponds to a value, for example, around the middle of the first search range.

If CIN=8 is set as described above, in the first updating period TP1 (a first updating period), as indicated by the arrow E3 in FIG. 18, the transition of the signal level of the signal STA is made in the case in which the clock cycle value reaches CCT=8. When the transition of the signal level of the signal STP is made in accordance with the signal STA, the phase comparison between the signal STP and the clock signal CK2 is performed. For example, the phase comparison of sampling the clock signal CK2 with the signal STP is performed, the H level of the clock signal CK2 is sampled as indicated by the arrow E4, and the H level is set as the phase comparison result. In the case in which the phase comparison result is the H level as described above, the logic level of the bit b4 as the MSB of the digital value DQ is determined as b4=1.

Since b4=1 is obtained in such a manner, the search range of the binary search is narrowed, and it is determined that the CIN corresponding to the conclusive digital value DQ exists within the search range of, for example, 8 through 15. Then, the clock cycle designation value is updated to, for example, CIN=12 so as to be set to the value (e.g., a value around the middle thereof) within the search range.

If the update to CIN=12 is performed as described above, in the subsequent updating period TP2 (a second updating period), as indicated by the arrow E5, the transition of the signal level of the signal STA is made in the case in which the clock cycle value reaches CCT=12. Then, the phase comparison between the signal STP and the clock signal CK2 is performed, and since the L level of the clock signal CK2 is sampled as indicated by, for example, the arrow E6, the L level is set as the phase comparison result. In the case in which the phase comparison result is the L level as described above, the logic level of the next bit b3 of the digital value DQ is determined as b3=0.

Since b4=1 and b3=0 are obtained in such a manner, the search range of the binary search is narrowed, and it is determined that the CIN corresponding to the conclusive digital value DQ exists within the search range of, for example, 8 through 11. Then, the clock cycle designation value is updated to, for example, CIN=10 so as to be set to the value (e.g., a value around the middle thereof) within the search range.

If the update to CIN=10 is performed as described above, in the subsequent updating period TP3 (a third updating period), as indicated by the arrow E7, the transition of the signal level of the signal STA is made in the case in which the clock cycle value reaches CCT=10. Then, the phase comparison between the signal STP and the clock signal CK2 is performed, and since the H level of the clock signal CK2 is sampled as indicated by, for example, the arrow E8, the H level is set as the phase comparison result. In the case in which the phase comparison result is the H level as described above, the logic level of the next bit b2 of the digital value DQ is determined as b2=1.

Finally, the update to CIN=11 is performed, and in the subsequent updating period TP4 (a fourth updating period), as indicated by the arrow E9, the transition of the signal level of the signal STA is made in the case in which the clock cycle value reaches CCT=11. Then, the phase comparison between the signal STP and the clock signal CK2 is performed, and since the H level of the clock signal CK2 is sampled as indicated by, for example, the arrow E10, the H level is set as the phase comparison result. In the case in which the phase comparison result is the H level as described above, the bit b1 as the LSB of the digital value DQ is set to b1=1. Then, as indicated by the arrow E11, DQ=1011 (binary number) is output as the output code as the conclusive digital value.

By using the method of such binary search, it becomes possible to quickly obtain the digital value DQ corresponding to the time difference in transition timing between the signals SAT, STP. For example, in the related art method of Document 4 described above, in the case of FIG. 18, the time measurement up to, for example, 15 times is necessary for obtaining the conclusive digital value DQ. In contrast, according to the method of the present embodiment, as shown in FIG. 18, the conclusive digital value DQ can be obtained with, for example, four times of updating periods, and thus, the speeding-up of the time-to-digital conversion can be achieved.

In particular, in the case in which the resolution Δt is made finer, and the number of bits L of the digital value DQ becomes large, the related art method requires to perform the time measurement, for example, about 2L times, and thus, the conversion time becomes extremely long. In contrast, according to the method of the present embodiment, the conclusive digital value DQ can be obtained with, for example, L times of updating periods, and thus, the dramatic speeding-up of the time-to-digital conversion can be achieved compared to the related art method.

It should be noted that after obtaining the higher bit side of the digital value DQ using the binary search method shown in FIG. 18, it is possible to obtain the lower bit side (e.g., lower bits including the LSB, or the LSB as the lower bit) using the updating method explained with reference to, for example, FIG. 15 through FIG. 17. For example, in FIG. 18, the clock cycle designation value CIN is updated so as to be a value within the search range while sequentially narrowing the search range (successive approximation range) as in the successive approximation type A/D conversion. In contrast, in the updating method shown in FIG. 15 through FIG. 17, the update of increasing or decreasing the clock cycle designation value CIN by ±GK based on the phase comparison result as in the case of the A-sigma type A/D conversion. The value GK is a gain coefficient, and fulfills GK1. Specifically, in the case of the phase comparison result that the signal STP lags in phase behind the clock signal CK2, the update (a digital arithmetic processing) of increasing the clock cycle designation value CIN by +GK is performed. In contrast, in the case of the phase comparison result that the signal STP leads in phase over the clock signal CK2, the update (a digital arithmetic processing) of decreasing the clock cycle designation value CIN by GK is performed. By combining the two methods with each other as described above, it becomes possible to achieve both of the speeding-up and the increase in resolution of the time-to-digital conversion.

9. Physical Quantity Measurement Device, Electronic Apparatus, and Vehicle

Figure 19:
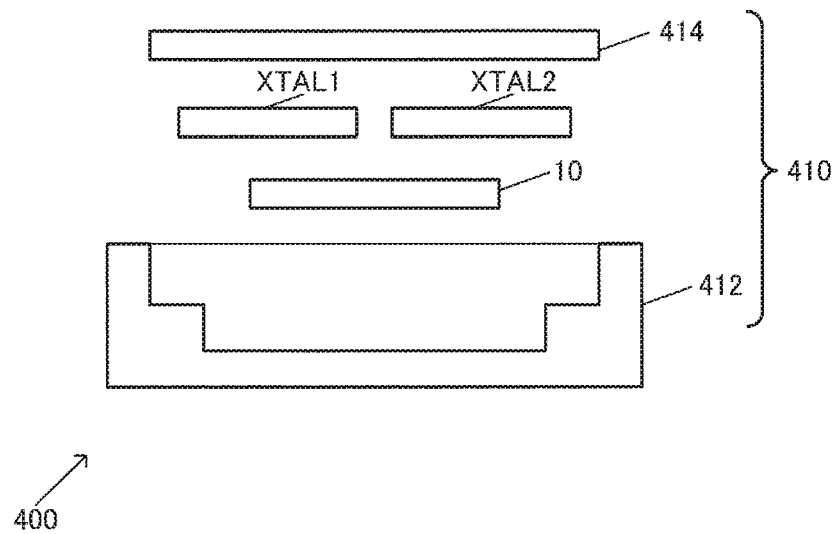
FIG. 19 is a diagram showing a configuration example of a physical quantity measurement device.

FIG. 19 shows a configuration example of the physical quantity measurement device 400 according to the present embodiment. The physical quantity measurement device 400 includes the circuit device 10 according to the present embodiment, the resonator XTAL1 (a first resonator, a first resonator element) for generating the clock signal CK1, and the resonator XTAL2 (a second resonator, a second resonator element) for generating the clock signal CK2. Further, it is possible for the physical quantity measurement device 400 to include a package 410 for housing the circuit device 10, and the resonators XTAL1, XTAL2. The package 410 is formed of, for example, a base section 412 and a lid section 414. The base section 412 is a member made of an insulating material such as ceramic, and having, for example, a box-like shape, and the lid section 414 is a member to be bonded to the base section 412, and having, for example, a plate-like shape. On the bottom surface, for example, of the base section 412, there are disposed external connection terminals (external electrodes) to be connected to external equipment. In an internal space (a cavity) formed by the base section 412 and the lid section 414, there are housed the circuit device 10 and the resonators XTAL1, XTAL2. Further, by sealing the internal space with the lid section 414, the circuit device 10 and the resonators XTAL1, XTAL2 are airtightly encapsulated in the package 410.

The circuit device 10 and the resonators XTAL1, XTAL2 are installed in the package 410. Further, terminals of the resonators XTAL1, XTAL2 and terminals (pads) of the circuit device 10 (IC) are electrically connected respectively to each other with interconnections of the package 410. The circuit device 10 is provided with the oscillation circuits 101, 102 for oscillating the resonators XTAL1, XTAL2, and by oscillating the resonators XTAL1, XTAL2 using these oscillation circuits 101, 102, the clock signals CK1, CK2 are generated.

For example, in the related art method of Document 4 described above, the first and second oscillation circuits are provided respectively to the first and second quartz crystal resonators, and the circuit device does not incorporate the first and second oscillation circuits. Therefore, it is not possible to realize the phase synchronization between the first and second clock signals due to the PLL circuit 120. Further, there is a disadvantage that it is not possible to perform the control process common to the first and second oscillation circuits in the circuit device.

It should be noted that a variety of practical modifications can be made as the configuration of the physical quantity measurement device 400. It is also possible for, for example, the base section 412 to have a plate-like shape, and for the lid section 414 to have a shape provided with a recess formed inside the lid section 414. Further, a variety of practical modifications can be made on the installation configuration and the wiring connection of the circuit device 10 and the resonators XTAL1, XTAL2 in the package 410. Further, the resonators XTAL1, XTAL2 are not required to be configured as completely separated parts, but can also be first and second oscillation areas provided to a single member. Further, it is also possible to provide the physical quantity measurement device 400 (the package 410) with three or more resonators. In this case, it is sufficient to provide three or more oscillation circuits corresponding to the resonators to the circuit device 10.

Figure 20:
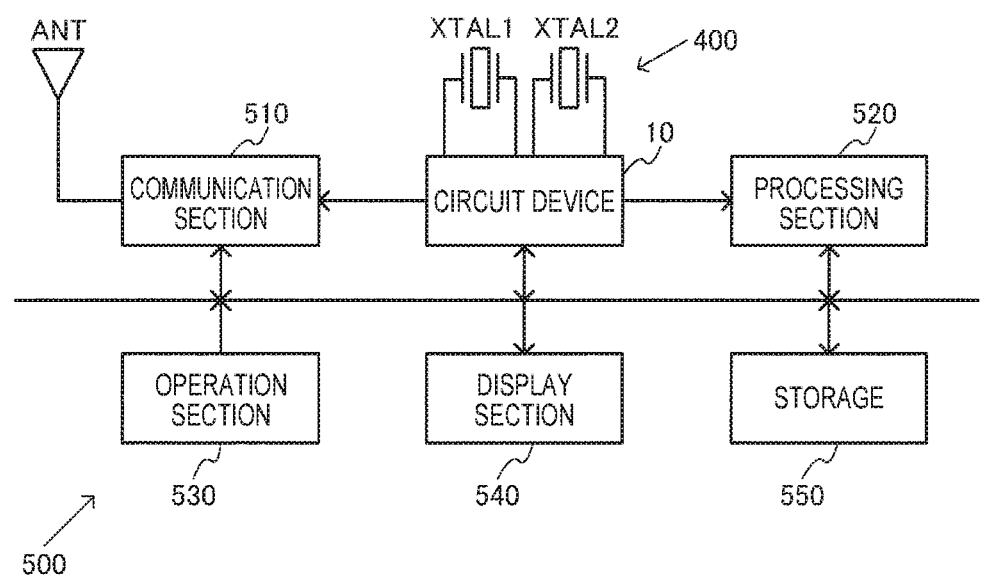
FIG. 20 is a diagram showing a configuration example of an electronic apparatus.

FIG. 20 shows a configuration example of an electronic apparatus 500 including the circuit device 10 according to the present embodiment. The electronic apparatus 500 includes the circuit device 10 according to the present embodiment, the resonators XTAL1, XTAL2, and a processing section 520. Further, the electronic apparatus 500 can include a communication section 510, an operation section 530, a display section 540, a storage 550, and an antenna ANT. The circuit device 10 and the resonators XTAL1, XTAL2 constitute the physical quantity measurement device 400. It should be noted that the configuration of the electronic apparatus 500 is not limited to the configuration shown in FIG. 20, but it is possible to adopt a variety of practical modifications such as elimination of some of the constituents or addition of other constituents.

As the electronic apparatus 500, there can be assumed a variety of apparatuses such as a measurement instrument for measuring a physical quantity such as a distance, time, flow speed, or a flow rate, a biological information measurement apparatus (e.g., a ultrasonic measurement device, a sphygmograph, and a blood-pressure measurement device), an in-car apparatus (e.g., equipment for automated driving), a network-related apparatus such as a base station, or a router, a wearable apparatus such as a head-mounted display device, or a timepiece related apparatus, a printer, a projection apparatus, a robot, a portable information terminal (e.g., a smartphone, a cellular phone, a portable video game player, a laptop PC, or a tablet PC), a content supply terminal for delivering contents, a video apparatus such as a digital camera or a video camera.

The communication section 510 (a wireless circuit) performs a process of receiving data externally via the antenna ANT and transmitting data to the outside. The processing section 520 performs a control process of the electronic apparatus 500, a variety of types of digital processing of the data transmitted or received via the communication section 510. Further, the processing section 520 performs a variety of processes using the physical quantity information measured by the physical quantity measurement device 400. The function of the processing section 520 can be realized by a processor such as a microcomputer.

The operation section 530 is for allowing the user to perform an input operation, and can be realized by operation buttons, a touch panel display, and so on. The display section 540 is for displaying a variety of types of information, and can be realized by a display using a liquid crystal, an organic EL, and so on. It should be noted that in the case of using the touch panel display as the operation section 530, it results that the touch panel display also functions as the operation section 530 and the display section 540. The storage 550 is for storing the data, and the function thereof can be realized by a semiconductor memory such as a RAM or a ROM, a hard disk drive (HDD), or the like.

Figure 21:
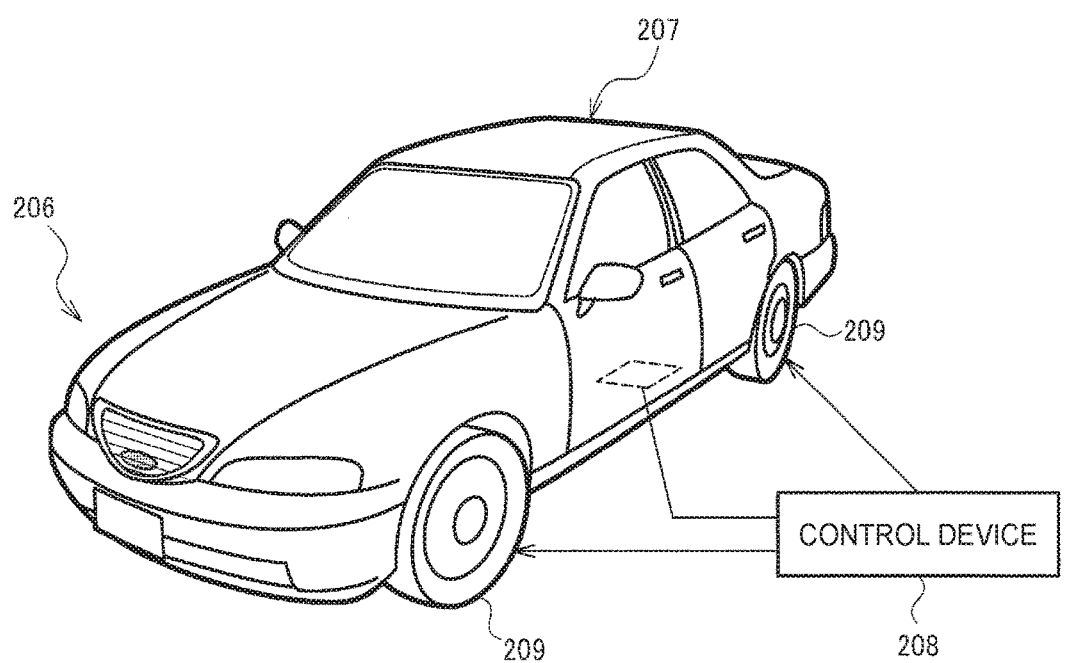
FIG. 21 is a diagram showing a configuration example of a vehicle.

FIG. 21 shows an example of a vehicle including the circuit device according to the present embodiment. The circuit device (the oscillator) according to the present embodiment can be incorporated in a variety of types of vehicles such as a car, an airplane, a motorbike, a bicycle, a robot, a ship, or a boat. The vehicle is equipment or an apparatus, which is provided with a drive mechanism such as an engine or an electric motor, a steering mechanism such as a steering wheel or a helm, and a variety of electronic apparatuses (in-car equipment), and moves on the ground, in the air, or on the sea. FIG. 21 schematically shows a car 206 as a specific example of the vehicle. The car 206 (the vehicle) incorporates a physical quantity measurement device (not shown) having the circuit device according to the present embodiment and an resonator. The control device 208 performs a variety of control processes based on the physical quantity information measured by the physical quantity measurement device. For example, in the case in which the distance information of an object located in the periphery of the car 206 is measured as the physical quantity information, the control device 208 performs a variety of control processes for the automated driving using the distance information thus measured. The control device 208 controls the stiffness of the suspension, and controls the brake of each of the wheels 209 in accordance with, for example, the attitude of a car body 207. It should be noted that the apparatus incorporating the circuit device or the physical quantity measurement device according to the present embodiment is not limited to such a control device 208, but the circuit device or the physical quantity measurement device according to the present embodiment can be incorporated in a variety of apparatuses (in-car equipment) provided to a vehicle such as the car 206.

It should be noted that although the present embodiment is hereinabove described in detail, it should easily be understood by those skilled in the art that it is possible to make a variety of modifications not substantially departing from the novel matters and the advantage of the invention. Therefore, all of such modified examples should be included in the scope of the invention. For example, a term (e.g., clock cycle designation value, control voltage or PLL circuit) described at least once with a different term (e.g., clock cycle designation information, control signal or synchronizing circuit) having a broader sense or the same meaning in the specification or the accompanying drawings can be replaced with the different term in any part of the specification or the accompanying drawings. Further, all of the combinations of the present embodiment and the modified examples are also included in the scope of the invention. Further, the configurations and actions of the circuit device, the physical quantity measurement device, an electronic apparatus, and the vehicle, the configuration of the PLL circuit, the phase synchronization process, the oscillation process, the time-to-digital conversion process, the generation process of the first and second signals, the phase comparison process, and so on are not limited to those described as the present embodiment, but a variety of practical modifications can be made.

The entire disclosure of Japanese Patent Application No. 2016-187912, filed Sep. 27, 2016 is expressly incorporated by reference herein.

What is claimed is:

1. A circuit device comprising:
a time-to-digital conversion circuit, to which a first clock signal generated using a first resonator, and having a first clock frequency, and a second clock signal generated using a second resonator, and having a second clock frequency different from the first clock frequency are input, and which converts time into a digital value using the first clock signal and the second clock signal; and
a PLL circuit arranged configured to perform phase synchronization between the first clock signal and the second clock signal, wherein
defining a resolution of the time-to-digital conversion as Δt, the PLL circuit performs the phase synchronization between the first clock signal and the second clock signal so as to fulfill the following expression:
Δt=|N−M|/(N×f2)=|N−M|/(M×f1), wherein f1 corresponds to the first clock frequency, f2 corresponds to the second clock frequency, and N and M are integers that are different from each other and greater than or equal to 2.

2. The circuit device according to claim 1, wherein time-to-digital conversion circuit converts the time into the digital value with the resolution Δt expressed as follows:

$$\Delta t=|1/f1-1/f2|=|f1-f2|/(f1\times f2).$$

3. The circuit device according to claim 1, wherein the PLL circuit performs the phase synchronization between the first clock signal and the second clock signal so as to fulfill N/f1=M/f2.

4. The circuit device according to claim 1, wherein the PLL circuit includes a phase detector adapted to perform a phase comparison between (i) the first clock signal or a signal based on the first clock signal, and (ii) the second clock signal or a signal based on the second clock signal.

5. The circuit device according to claim 4, wherein the PLL circuit includes
a first frequency divider circuit adapted to divide the frequency of the first clock signal to obtain a first frequency-divided clock signal, and output the first frequency-divided clock signal to the phase detector as the signal based on the first clock signal, and
a second frequency divider circuit adapted to divide the frequency of the second clock signal to obtain a second frequency-divided clock signal, and output the second frequency-divided clock signal to the phase detector as the signal based on the second clock signal.

6. The circuit device according to claim 5, wherein defining the first clock frequency as f1 and the second clock frequency as f2, the first frequency divider circuit divides the frequency of the first clock signal, and the second frequency divider circuit divides the frequency of the second clock signal so as to fulfill N/f1=M/f2 (N, M are integers different from each other and each no smaller than 2).

7. The circuit device according to claim 4, further comprising:
a first oscillation circuit controlled based on a phase comparison result of the phase detector, and adapted to oscillate the first resonator to generate the first clock signal.

8. The circuit device according to claim 7, further comprising:
a second oscillation circuit adapted to oscillate the second resonator to generate the second clock signal.

9. The circuit device according to claim 1, wherein the time-to-digital conversion circuit converts a time difference in transition timing between a first signal and a second signal into a digital value.

10. A physical quantity measurement device comprising:
the circuit device according to claim 1;
the first resonator adapted to generate the first clock signal; and
the second resonator adapted to generate the second clock signal.

11. A physical quantity measurement device comprising:
the circuit device according to claim 2;
the first resonator adapted to generate the first clock signal; and
the second resonator adapted to generate the second clock signal.

12. An electronic apparatus comprising:
the circuit device according to claim 1.

13. An electronic apparatus comprising:
the circuit device according to claim 2.

14. A vehicle comprising:
the circuit device according to claim 1.

15. A vehicle comprising:
the circuit device according to claim 2.

* * * * *